US012625204B2

(12) United States Patent
Saleh et al.

(10) Patent No.: US 12,625,204 B2
(45) Date of Patent: *May 12, 2026

(54) HYBRID COUPLER FOR MAGNETIC RESONANCE IMAGING

(71) Applicant: Imam Abdulrahman Bin Faisal University, Dammam (SA)

(72) Inventors: Gameel Saleh, Dammam (SA); Ashraf Abuelhaija, Dammam (SA)

(73) Assignee: Imam Abdulrahman Bin Faisal University, Dammam (SA)

( * ) Notice: Subject to any disclaimer, the term of this patent is extended or adjusted under 35 U.S.C. 154(b) by 0 days.

This patent is subject to a terminal disclaimer.

(21) Appl. No.: 19/355,695

(22) Filed: Oct. 10, 2025

(65) Prior Publication Data

US 2026/0036656 A1 Feb. 5, 2026

Related U.S. Application Data

(63) Continuation of application No. 18/423,792, filed on Jan. 26, 2024, now Pat. No. 12,467,993.

(51) Int. Cl.
*G01R 33/341* (2006.01)
*G01R 33/343* (2006.01)
*G01R 33/36* (2006.01)
*G01R 33/54* (2006.01)

(52) U.S. Cl.
CPC ......... *G01R 33/341* (2013.01); *G01R 33/343* (2013.01); *G01R 33/3635* (2013.01); (Continued)

(58) Field of Classification Search
CPC ............ G01R 33/3635; G01R 33/3664; G01R 33/34007; G01R 33/3628; G01R 33/3642; (Continued)

(56) References Cited

U.S. PATENT DOCUMENTS 11,493,578 B1    11/2022    Abuelhaija et al.
2004/0266362 A1    12/2004    Watkins et al.
(Continued)

FOREIGN PATENT DOCUMENTS

WO    WO 2022/229471 A1    11/2022

OTHER PUBLICATIONS

Ashraf Abuelhaija, et al., "Two-section branch-line hybrid couplers based broadband transmit/receive switch", International Journal of Electrical and Computer Engineering (IJECE), vol. 13, No. 3, Jun. 2023, pp. 2600-2607.

(Continued)

*Primary Examiner* — Rishi R Patel
(74) *Attorney, Agent, or Firm* — Oblon, McClelland, Maier & Neustadt, L.L.P.

(57) ABSTRACT

A transmit/receive switch for magnetic resonance imaging (MRI) of a $^1$H atomic nucleus at 3T (tesla) and 7T magnetic field strengths includes a first and second dielectric substrate and a first and a second microstripline hybrid coupler formed on the first and second dielectric substrates respectively. A first port and a second port are connected to a first junction and a second junction respectively of the first microstripline hybrid coupler, a third port and a fourth port are connected to a third junction and a fourth junction of the second microstripline hybrid coupler respectively. Each port is connected by a matching network embodied by a microstripline wire to a pair of parallel resonant circuits. The transmit/receive switch is configured to operate at a fundamental frequency of about 127.8 MHz at 3T and at a third harmonic frequency of about 298 MHz at 7T.

11 Claims, 13 Drawing Sheets

(52) U.S. Cl.
CPC ........ G01R 33/543 (2013.01); *G01R 33/3628*
(2013.01); *G01R 33/3657* (2013.01)

(58) Field of Classification Search
CPC .. G01R 33/341; G01R 33/343; G01R 33/543;
G01R 33/36; G01R 33/3614; G01R
33/3657
See application file for complete search history.

(56) References Cited

U.S. PATENT DOCUMENTS

2011/0215807 A1\*   9/2011   Misic ................. G01R 33/3678
324/322
2023/0042250 A1     2/2023   Abuelhaija et al.

OTHER PUBLICATIONS

Ashraf Abuelhaija, et al., "Broadbands Four-Branch Hybrid Coupler-Based T/R Switch for 7-Tesla Magnetic Resonance Imaging", International Journal on Communications Antenna and Propagation (I.Re.C.A.P.), vol. 12, No. 5, Oct. 2022, pp. 380-384.

Ashraf Abuelhaija, et al., "Symmetrical and asymmetrical microstripline-based transmit/receive switches for 7-Tesla magnetic resonance imaging", International Journal of Circuit Theory and Applications, vol. 49, Issue 7, Jul. 2021, pp. 2082-2093.

L. Chiu, et al., "Wideband parallel-strip 90° hybrid coupler with swap", Electronics Letters, vol. 44, No. 11, May 22, 2008, 2 pages.

Abuelhaija, Ashraf, and Gameel Saleh. "Microstripline Switch for 3T and 7T Proton Coils." (Oct. 2023). (Year: 2023).

\* cited by examiner

1000

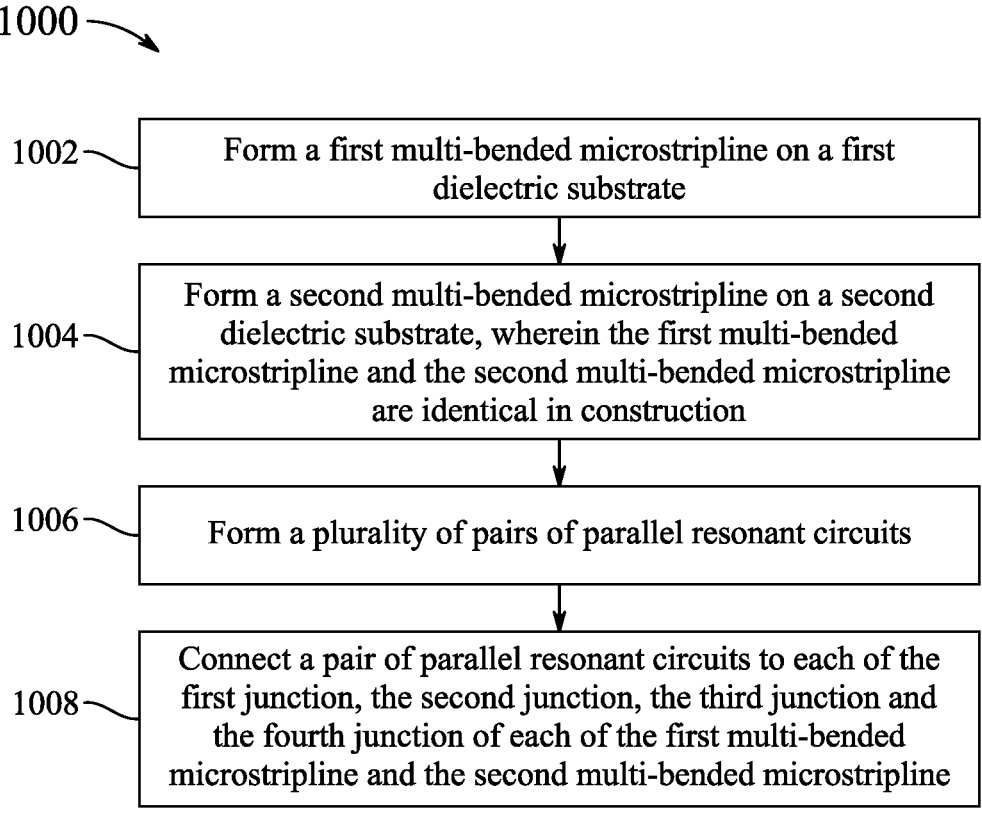

1002 — Form a first multi-bended microstripline on a first dielectric substrate

1004 — Form a second multi-bended microstripline on a second dielectric substrate, wherein the first multi-bended microstripline and the second multi-bended microstripline are identical in construction 1006 — Form a plurality of pairs of parallel resonant circuits 1008 — Connect a pair of parallel resonant circuits to each of the first junction, the second junction, the third junction and the fourth junction of each of the first multi-bended microstripline and the second multi-bended microstripline

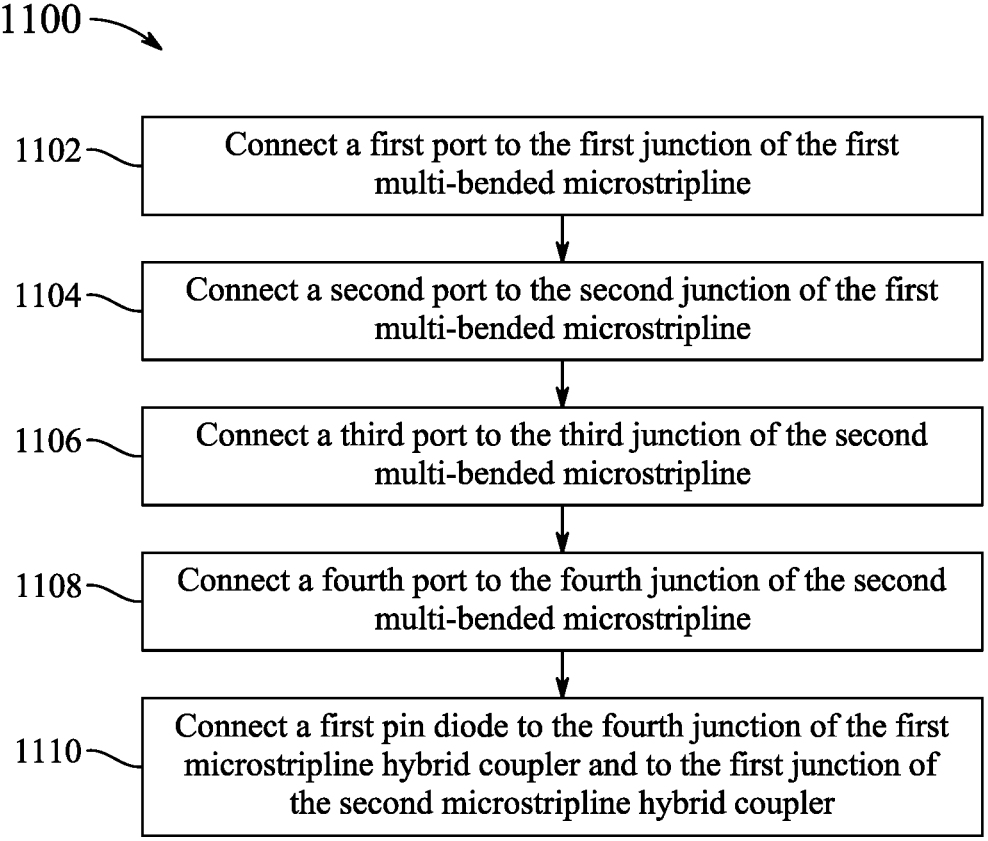

1102 — Connect a first port to the first junction of the first multi-bended microstripline 1104 — Connect a second port to the second junction of the first multi-bended microstripline 1106 — Connect a third port to the third junction of the second multi-bended microstripline 1108 — Connect a fourth port to the fourth junction of the second multi-bended microstripline 1110 — Connect a first pin diode to the fourth junction of the first microstripline hybrid coupler and to the first junction of the second microstripline hybrid coupler

*FIG. 11*

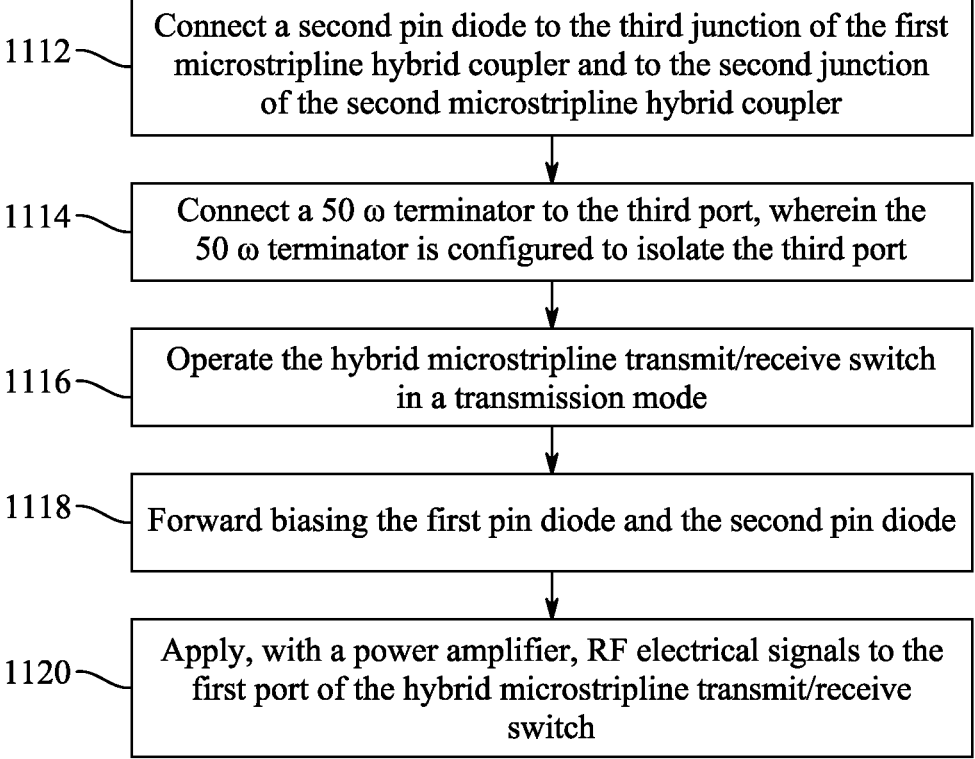

1112 — Connect a second pin diode to the third junction of the first microstripline hybrid coupler and to the second junction of the second microstripline hybrid coupler 1114 — Connect a 50 ω terminator to the third port, wherein the 50 ω terminator is configured to isolate the third port 1116 — Operate the hybrid microstripline transmit/receive switch in a transmission mode 1118 — Forward biasing the first pin diode and the second pin diode 1120 — Apply, with a power amplifier, RF electrical signals to the first port of the hybrid microstripline transmit/receive switch

*FIG. 11 (Cont'd)*

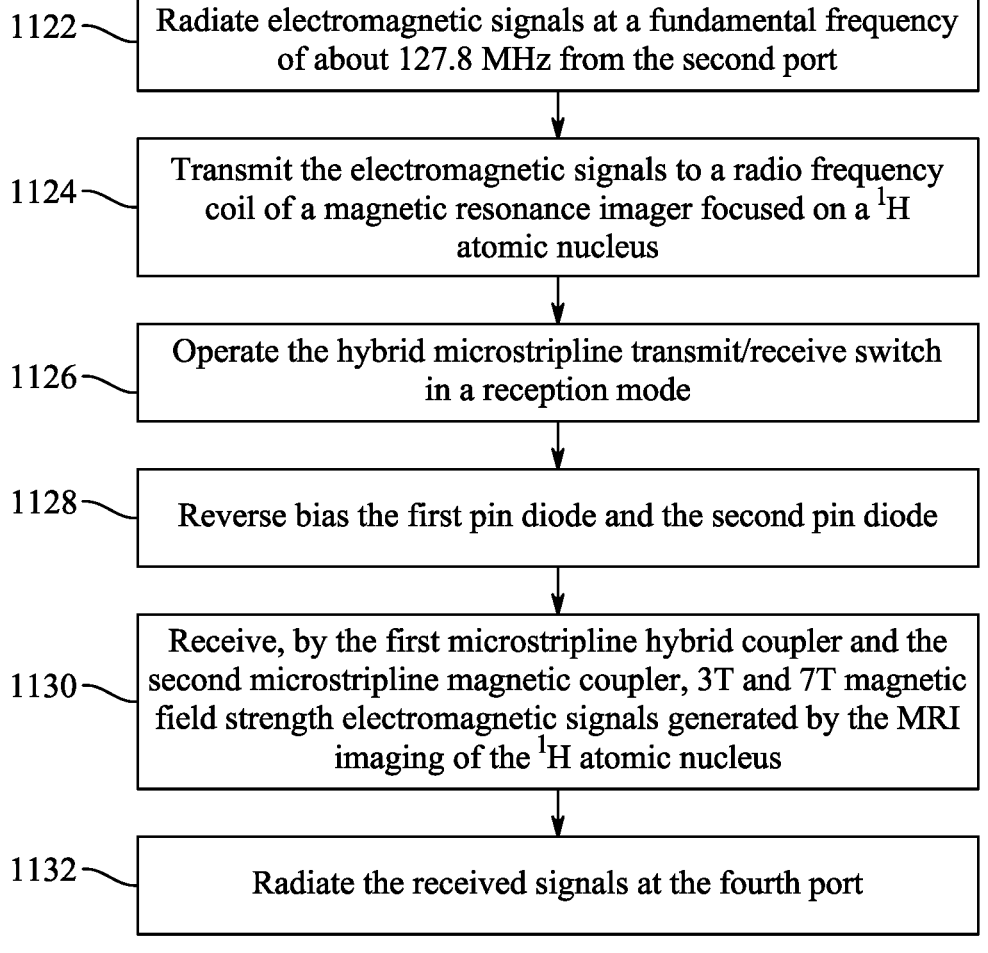

1122 — Radiate electromagnetic signals at a fundamental frequency of about 127.8 MHz from the second port 1124 — Transmit the electromagnetic signals to a radio frequency coil of a magnetic resonance imager focused on a $^1$H atomic nucleus 1126 — Operate the hybrid microstripline transmit/receive switch in a reception mode 1128 — Reverse bias the first pin diode and the second pin diode 1130 — Receive, by the first microstripline hybrid coupler and the second microstripline magnetic coupler, 3T and 7T magnetic field strength electromagnetic signals generated by the MRI imaging of the $^1$H atomic nucleus 1132 — Radiate the received signals at the fourth port

*FIG. 11 (Cont'd)*

HYBRID COUPLER FOR MAGNETIC RESONANCE IMAGING

CROSS-REFERENCE TO RELATED APPLICATIONS

The present application is a Continuation of U.S. application Ser. No. 18/423,792, now allowed, having a filing date of Jan. 26, 2024.

CROSS REFERENCE TO RELATED APPLICATIONS

The present application is related to "Broadband Switch For 3T And 7T Magnetic Resonance Imaging, which is incorporated herein by reference in its entirety.

STATEMENT REGARDING PRIOR DISCLOSURE BY THE INVENTORS

Aspects of the present disclosure are described in "Broadbands Four-Branch Hybrid Coupler-Based T/R Switch for 7-Tesla Magnetic Resonance Imaging", published by International Journal on Communication Antenna and Propagation, (2022) Vol. 12 (5), pp. 380-384, which is incorporated herein by reference in its entirety.

BACKGROUND

Technical Field

The present disclosure is directed to a device, system and method for magnetic resonance imaging (MRI) of a $^1$H atomic nucleus, especially at 3T and 7T magnetic field strengths.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present technology.

Transmit/receive (T/R) switches are important components in magnetic resonance imaging (MRI) systems, as they enable the switching between transmit and receive modes. During transmit, the T/R switch allows the transmission of radiofrequency (RF) pulses from the MRI system to the body being imaged. During a receive mode, the switch enables the detection of the resulting MR signals, which are then used to construct the MRI image. The use of T/R switches ensures that the RF energy is delivered during transmission from the RF amplifier to a magnetic resonance coil and to handle the receive signal from the magnetic resonance coil to the receiver amplifier. This prevents interference and noise in the detected signals. Additionally, T/R switches provide isolation between the transmit and receive paths, which is essential for achieving high-quality images with minimal distortion. The RF coils are connected to RF circuits including transmit/receive (T/R) switching circuits. The T/R switch is used to actuate the RF pulses to/from the coil that either propagate these pulses into the body or receive the irradiated signal from the body and passes it to the receiver through the switch for acquisition and further processing. The T/R switches can transmit/receive pulses of a single frequency to/from RF coil that is in resonance with the spins of one of the atomic nuclei ($^1$H protons, for example) when exposed to a certain magnetic field strength. PIN diode RF switches that are based on discrete components ensure low insertion loss and high isolation, which are necessary for achieving high-quality images. In a T/R switch based with PIN diode topology a switching time of 1 us can be achieved. In some of the existing designs, a PIN diode T/R switch includes many sections of coplanar waveguide lines to achieve high frequency broadband. Also, in some of the existing designs, a dual tuned PIN diode $^1$H/$^{31}$P T/R switch for 3T MRI includes two passive trap circuits that are tuned to the speed of precession of $^1$H and $^{31}$P magnetic resonances. However, PIN diode switches have limited power handling, limited frequency range, and can be damaged from the high power pulses. Also, a PIN diode switch with BJTs enhances the dual-driver circuit but has a long rise time.

Each of the aforementioned designs suffers from one or more drawbacks hindering their adoption, such as long rise time, which causes a delay in switching. Accordingly, it is one object of the present disclosure to provide a transmit/receive switch, device, system and method for magnetic resonance imaging (MRI) of a $^1$H atomic nucleus that includes both 3T and 7T magnetic field strengths and which is able to handle higher powers, has a broadband frequency range and a short rise time.

SUMMARY

In an exemplary embodiment, a hybrid coupler for magnetic resonance imaging (MRI) of a $^1$H atomic nucleus at 3T (tesla) and 7T magnetic field strengths is described. The hybrid coupler includes a dielectric substrate having a first edge opposite a second edge and a third edge opposite a fourth edge. A first central axis of the dielectric substrate is configured to bisect the first edge and the second edge and to extend from the first edge to the second edge and a second central axis of the dielectric substrate is configured to bisect the third edge and the fourth edge and to extend from the third edge to the fourth edge. The hybrid coupler also includes a multi-bended microstripline configured to have a first arm, a second arm, a third arm and a fourth arm. The hybrid coupler also includes a first port connected by a microstripline wire to a junction between the first arm and the fourth arm. The microstripline wire acts as a matching network between each port and its respective junction. The hybrid coupler also includes a first pair of parallel resonant circuits connected to the junction between the first arm and the fourth arm. The hybrid coupler also includes a second port connected by a microstripline wire to a junction between the third arm and the fourth arm. The hybrid coupler also includes a second pair of parallel resonant circuits connected to the junction between the third arm and the fourth arm. The hybrid coupler also includes a third port connected by a microstripline wire to a junction between the third arm and the second arm. The hybrid coupler also includes a third pair of parallel resonant circuits connected to the junction between the third arm and the second arm. The hybrid coupler also includes a fourth port connected by a microstripline wire to a junction between the first arm and the second arm. The hybrid coupler also includes a fourth pair of parallel resonant circuits connected to the junction between the first arm and the second arm. The first arm includes a first angled leg, an S-shaped loop connected to the first angled leg, an inverted S-shaped loop connected to the S-shaped loop, and a second angled leg connected to the inverted S-shaped loop. The S-shaped loop and the inverted S-shaped loop have mirror image symmetry about the second central axis. The second arm includes a first angled leg, a first straight leg parallel to the second edge, a second straight leg perpendicular to the first straight leg, a first loop which extends towards the third edge, a second loop which extends towards the second central axis, a third loop which extends towards the fourth edge, a third straight leg parallel to the second straight leg, a fourth straight leg parallel to the second edge and extending towards the fourth edge and a second angled leg. The third arm is located opposite the first arm and is a mirror image of the first arm about the first central axis. The fourth arm is located opposite the second arm and is a mirror image of the second arm about the second central axis. The first arm and the third arm each have a microstripline width Wa, the second arm and the fourth arm each have a microstripline width Wb. Wb is about seven times Wa. The multi-bended microstripline is configured to receive RF electrical signals at the first port and transmit RF electrical signals at a resonance frequency of about 127.8 MHz at each of the second port and at the fourth port. The secondary electrical signals at the fourth port are orthogonal to the secondary electrical signals at the second port. The secondary electrical signals at the fourth port are orthogonal to the secondary electrical signals at the second port. The secondary electrical signals are equally split between the second port and the fourth port, and the third port is isolated.

In another exemplary embodiment, a transmit/receive switch for magnetic resonance imaging (MRI) of a $^1$H atomic nucleus at 3T (tesla) and 7T magnetic field strengths is described. The transmit/receive switch includes a first dielectric substrate and a second dielectric substrate. Each dielectric substrate includes a top side, a bottom side, a first edge opposite to a second edge, and a third edge opposite to a fourth edge. A first central axis of each dielectric substrate is configured to bisect the first edge and the second edge and to extend from the first edge to the second edge and a second central axis of the dielectric substrate is configured to bisect the third edge and the fourth edge and to extend from the third edge to the fourth edge. The transmit/receive switch also includes a first microstripline hybrid coupler formed on the first dielectric substrate. The first microstripline hybrid coupler includes a multi-bended microstripline. The transmit/receive switch also includes a second microstripline hybrid coupler formed on the second dielectric substrate. The second microstripline hybrid coupler includes a multi-bended microstripline. The multi-bended microstripline of the second microstripline hybrid coupler is identical in construction to the multi-bended microstripline of the first microstripline hybrid coupler. Each multi-bended microstripline includes a first arm, a second arm, a third arm and a fourth arm, a first junction located between the first arm and the fourth arm, a second junction located between the first arm and the second arm, a third junction located between the second arm and the third arm, a fourth junction located between the third arm and the fourth arm. The transmit/receive switch also includes a plurality of pairs of parallel resonant circuits. A pair of parallel resonant circuits is connected to each of the first junction, the second junction, the third junction and the fourth junction of the first microstripline hybrid coupler and the second microstripline hybrid coupler. The transmit/receive switch also includes a first port connected to the first junction of the first microstripline hybrid coupler. The first port is configured to transmit electromagnetic signals into the first junction of the first microstripline hybrid coupler. The transmit/receive switch also includes a second port connected to the second junction of the first microstripline hybrid coupler. The transmit/receive switch also includes a third port connected to the third junction of the second microstripline hybrid coupler. The transmit/receive switch also includes a fourth port connected to the fourth junction of the second microstripline hybrid coupler. The transmit/receive switch also includes a switching circuit connected between the first microstripline hybrid coupler and the second microstripline hybrid coupler. The switching circuit includes a first PIN diode connected to the fourth junction of the first microstripline hybrid coupler and to the first junction of the second microstripline hybrid coupler, and a second PIN diode connected to the third junction of the first microstripline hybrid coupler and to the second junction of the second microstripline hybrid coupler. In a transmission state, the first PIN diode and the second PIN diode are forward biased and RF electromagnetic signals applied to the first port radiate from the second port. In a reception state, the first PIN diode and the second PIN diode are reverse biased, and 3T and 7T magnetic field strength electromagnetic signals generated by the MRI imaging of the $^1$H atomic nucleus are received by the first microstripline hybrid coupler and the second microstripline magnetic coupler and are radiated from the fourth port.

In yet another exemplary embodiment, a method of using a hybrid microstripline transmit/receive switch for magnetic resonance imaging (MRI) of X-atomic nuclei at 3 tesla (T) and 7T magnetic field strengths is described. The method includes forming a first multi-bended microstripline on a first dielectric substrate. The method also includes forming a second multi-bended microstripline on a second dielectric substrate. The first multi-bended microstripline and the second multi-bended microstripline are identical in construction. Each multi-bended microstripline includes a first arm, a second arm, a third arm and a fourth arm, a first junction located between the first arm and the fourth arm, a second junction located between the first arm and the second arm, a third junction located between the second arm and the third arm, a fourth junction located between the third arm and the fourth arm. The method also includes forming a plurality of pairs of parallel resonant circuits. The method also includes connecting a pair of parallel resonant circuits to each of the first junction, the second junction, the third junction and the fourth junction of each of the first multi-bended microstripline and the second multi-bended microstripline. The method also includes connecting a first port to the first junction of the first multi-bended microstripline. The method also includes connecting a second port to the second junction of the first multi-bended microstripline. The method also includes connecting a third port to the third junction of the second multi-bended microstripline. The method also includes connecting a fourth port to the fourth junction of the second multi-bended microstripline. The method also includes connecting a first PIN diode to the fourth junction of the first microstripline hybrid coupler and to the first junction of the second microstripline hybrid coupler. The method also includes connecting a second PIN diode to the third junction of the first microstripline hybrid coupler and to the second junction of the second microstripline hybrid coupler. The method also includes connecting a 50Ω terminator to the third port. The 50Ω terminator is configured to isolate the third port. The method also includes operating the hybrid microstripline transmit/receive switch in a transmission mode by forward biasing the first pin diode and the second pin diode, applying, with a power amplifier, RF electrical signals to the first port of the hybrid microstripline transmit/receive switch, radiating the RF electromagnetic signals from the second port, transmitting the electromagnetic signals to a radio frequency coil of a magnetic resonance imager focused on a $^1$H atomic nucleus. The method also includes operating the hybrid microstripline transmit/receive switch in a reception mode by reverse biasing the first pin diode and the second pin diode, receiving, by the first microstripline hybrid coupler and the second microstripline magnetic coupler, 3T and 7T magnetic field strength electromagnetic signals generated by the MRI imaging of the $^1$H atomic nucleus and radiating the received electromagnetic signals at a third harmonic frequency from the fourth port.

The foregoing general description of the illustrative embodiments and the following detailed description thereof are merely exemplary aspects of the teachings of this disclosure and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein:

FIG. 10 depicts a flowchart for a method of using a hybrid microstripline transmit/receive switch for magnetic resonance imaging (MRI) of X-atomic nuclei at 3 tesla (T) and 7T magnetic field strengths, according to certain embodiments.

FIG. 11 depicts a flowchart of a method of operating a hybrid microstripline transmit/receive switch for magnetic resonance imaging (MRI) of X-atomic nuclei at 3 tesla (T) and 7T magnetic field strengths.

DETAILED DESCRIPTION

Figure 1:
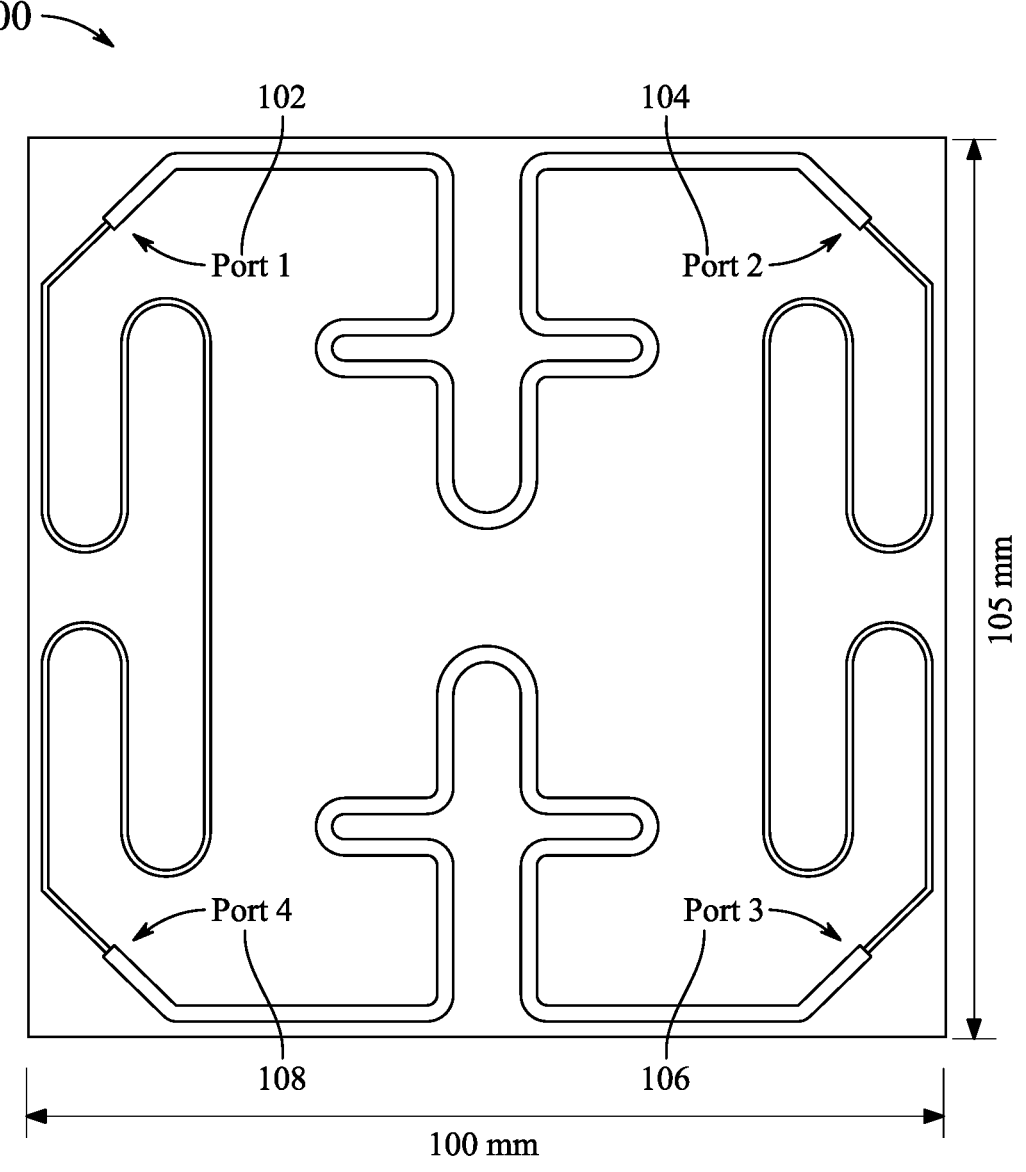
FIG. 1 depicts a circuit of the microstripline (MSL) based hybrid coupler, according to certain embodiments.

In the drawings, like reference numerals designate identical or corresponding parts throughout the several views. Further, as used herein, the words "a", "an" and the like generally carry a meaning of "one or more", unless stated otherwise.

Furthermore, the terms "approximately," "approximate", "about" and similar terms generally refer to ranges that include the identified value within a margin of 20%, 10%, or preferably 5%, and any values therebetween.

Proton magnetic resonance imaging (MRI) is used to interrogate hydrogen atoms for imaging purposes because it is the prevalent element in the body. In contrast, magnetic resonance spectroscopy (MRS) in MRI is used to interrogate other atomic nuclei (X-nuclei) such as $^{23}$Na, $^{13}$C, $^{31}$P, $^{19}$F, $^7$Li, etc. The $^1$H spins are used in imaging applications, while the other X-nuclei are used as a measure of the existence of certain diseases and tumors. The $^1$H and X-nuclei in the human body are excited using one or more radio frequency (RF) coils that transmit/receive signals of a single or multi frequencies to/from the body. Each frequency signal must be resonant with the speed of precession of the targeted protons and neutrons inside each type of atomic nuclei in a targeted body tissue. These RF coils are connected to RF circuits including transmit/receive (TR) switching circuits. The TR switch is used to handle the RF pulses to/from the coil that either propagate these pulses into the body or receive the irradiated signal from the body and pass it to the receiver, through the switch, for acquisition and further processing. The available switches can transmit/receive pulses of a single frequency to/from the RF coil that is in resonance with the spins of one of the atomic nuclei ($^1$H protons, for example) when exposed to a certain magnetic field strength.

Magnetic resonance imaging (MRI) scanners are medical devices that use magnetic fields, magnetic field gradients, and radio waves to generate images of anatomical features of a subject. The MRI scanners generate images of soft tissues, potentially uncovering tissue characteristics that indicate diseases. There is a demand in healthcare industry for high-quality MRI scanners that produce images with high resolution, superior contrast, and high signal-to-noise (SNR) ratio. To meet the aforementioned criteria, the MRI scanners require magnets with higher strength, which in turn increase the radio frequency (RF) power required to excite atoms, such as hydrogen atoms, at a corresponding resonant frequency. The higher the strength of the magnet in the MRI scanner, the higher the speed of precession of atomic nuclei, leading to an increase in the resonant frequency of an RF coil and the energy required to excite spins.

Figure 8:
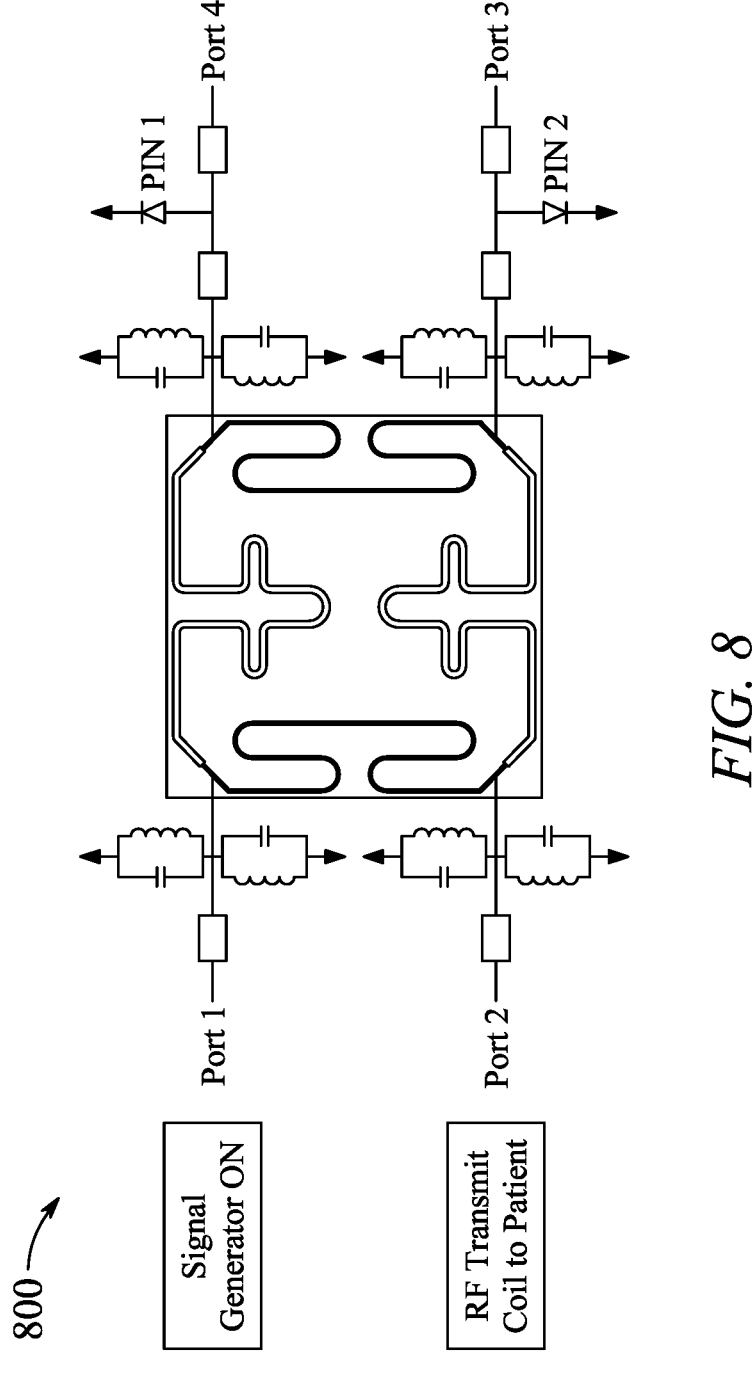
FIG. 8 depicts the $^1$H 3T and 7T MRI T/R switch with first PIN diode and the second PIN diode forward biased, according to certain embodiments.

An RF coil is controlled using a T/R switch (shown in FIG. 8). The RF coil is an electrical component that is located within a magnet assembly of an MRI apparatus (not shown) and designed to be placed relatively close to a subject. The subject may be, for example, a human patient. The RF coil may function as an antenna for transmitting RF signals and receiving signals from the subject. Known coil designs include body coils, head coils, and surface coils.

The T/R switch is an electrical component for directing an RF signal power from an RF amplifier to the RF coil, and a low power RF signal (also known as nuclear magnetic resonance signal (NMR) signal) from the RF coil to a pre-amplifier (also known as receiver). The T/R switch is designed to protect the pre-amplifier from damages caused by high power RF signal transmission while allowing the RF signal from the RF coil to be passed undistorted and undiminished to the pre-amplifier. The T/R switch may include four ports connected to various components.

Various aspects of the present disclosure provide a $^1$H T/R switch for 3T and 7T MRI based on microstripline hybrid couplers that can operate at two different frequencies corresponding to the Larmor frequency of the $^1$H nucleus at 3T (127.8 MHZ) and 7T (298 MHZ) magnetic field strengths, simultaneously. In a non-limiting example, a Rogers RO3010 substrate with relative permittivity (εr) 10.2 and thickness of 1.27 mm was used to design the coupler using an electromagnetic simulation tool. In a non-limiting example, the electromagnetic simulation tool is the Momentum tool (electromagnetic simulator) supported by ADS software (See: "Momentum Key Features", available from Keysight, 1400 Fountaingrove Parkway, Santa Rosa, California, United States of America).

In a non-limiting example, the width of the 50Ω arms (right and left) is about 1.18 mm, whereas the width of the 35.35Ω arms (top and bottom) is about 2.25 mm.

The lengths of all arms are quarter wavelength calculated at the fundamental frequency. The dimensions of the hybrid coupler are about 110 mm×about 105 mm. Once the input signal is inserted into port 1, this signal is split equally between ports 2 and 3 with 90° phase shift (quadrature outputs).

Aspects of the present disclosure are directed to a transmit/receive switch for magnetic resonance imaging (MRI) of a $^1$H atomic nucleus at 3T and 7T magnetic field strengths. The transmit/receive switch includes a first microstripline hybrid coupler formed on the first section, a switching circuit formed on a second section and a second microstripline hybrid coupler formed on a third section of a dielectric substrate. The first microstripline hybrid coupler and the second microstripline coupler each have an octagonal shape having a first cross-shaped arm extending from the first edge towards a second central axis, a second cross-shaped arm extending from the second edge towards the second central axis, a first T-shaped arm parallel to the third edge and extending towards a first central axis and a second T-shaped arm opposite the first T-shaped arm. A parallel resonant circuit is connected to each terminal of the first microstripline wire and the second first microstripline wire. A first port is connected to the parallel resonant circuit connected to the first corner of the first microstripline coupler and a second port is connected to the parallel resonant circuit connected to the second corner of the first microstripline coupler. A first PIN diode of the switching circuit is connected between the parallel resonant circuit connected to fourth corner of the first microstripline coupler and the parallel resonant circuit connected to the first corner of the second microstripline coupler. A second PIN diode of the switching circuit is connected between the parallel resonant circuit connected to third corner of the first microstripline coupler and the parallel resonant circuit connected to the second corner of the second microstripline coupler. A third port is connected to the parallel resonant circuit connected to the third corner of the second microstripline coupler, and a fourth port is connected to the parallel resonant circuit connected to the fourth corner of the second microstripline coupler. In a transmission state, the first PIN diode and the second PIN diode are forward biased, and 3T magnetic field strength electromagnetic signals transmitted from the first port radiate at a fundamental frequency of 127.8 MHz at the second port. In a reception state, the first PIN diode and the second PIN diode are reverse biased, and 7T magnetic field strength electromagnetic signals generated by the MRI imaging of the $^1$H atomic nucleus are received at the second port and the third port and are radiated at a third harmonic frequency of 298 MHz from the fourth port.

Figure 5:
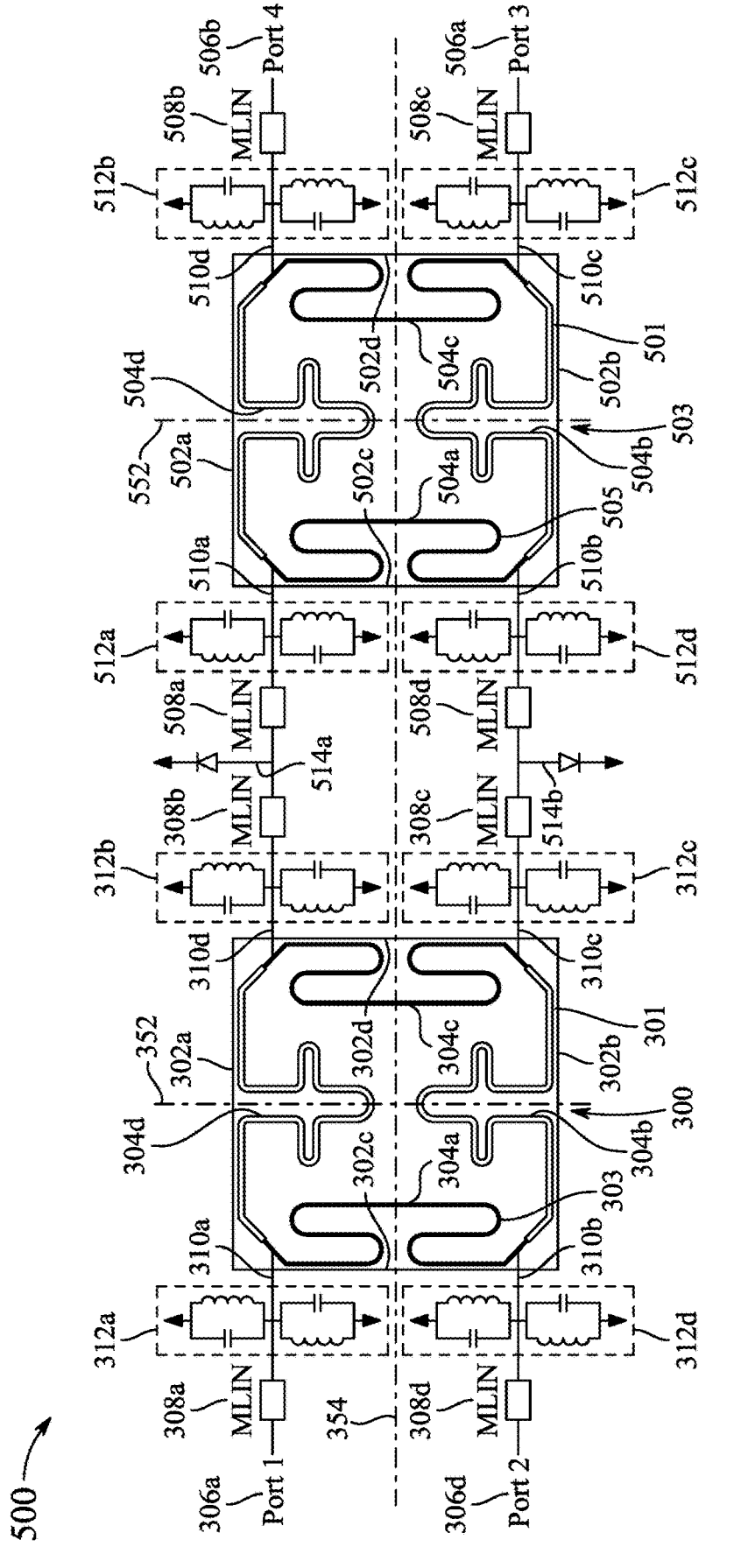
FIG. 5 depicts a circuit of a transmit/receive switch for magnetic resonance imaging (MRI) of a $^1$H atomic nucleus at 3T (tesla) and 7T magnetic field strengths, according to certain other embodiments.

FIG. 1 depicts a circuit of the microstripline (MSL) based hybrid coupler 100. The [1]H T/R switch for 3T and 7T MRI of the present disclosure is designed based on two microstripline based hybrid couplers 100 as shown in FIG. 5. The microstripline based hybrid couplers 100 operate at two different frequencies corresponding to the Larmor frequency of the 1 Hz, nucleus at 3T (127.8 megahertz (MHz) and 7T (298 MHz) magnetic field strengths, simultaneously. The MSL based hybrid couplers 100 are designed to operate at the fundamental frequency of 127.8 MHz. In a non-limiting example, a Rogers RO3010 substrate with relative permittivity (εr) 10.2 and thickness of 1.27 millimeter (mm) was used to design the MSL based hybrid couplers 100 by advanced design system (ADS) software using a Momentum electromagnetic (EM) simulation tool. The width of the 50Ω arms (right and left) is 1.18 mm, whereas the width of the 35.35Ω arms (top and bottom) is 2.25 mm. The length of all arms is a quarter wavelength calculated at the fundamental frequency. The dimensions of the MSL based hybrid couplers 100 are about 110 mm×about 105 mm. Once the input signal is input to port 1 102, the signal is split equally between port 2 104 and port 3 106 with a 90° phase shift (quadrature outputs). The microstriplines are designed in a multi-bended manner wherein the dimensions of the full T/R switch circuit are about 360 mm×about 200 mm.

Figure 2:
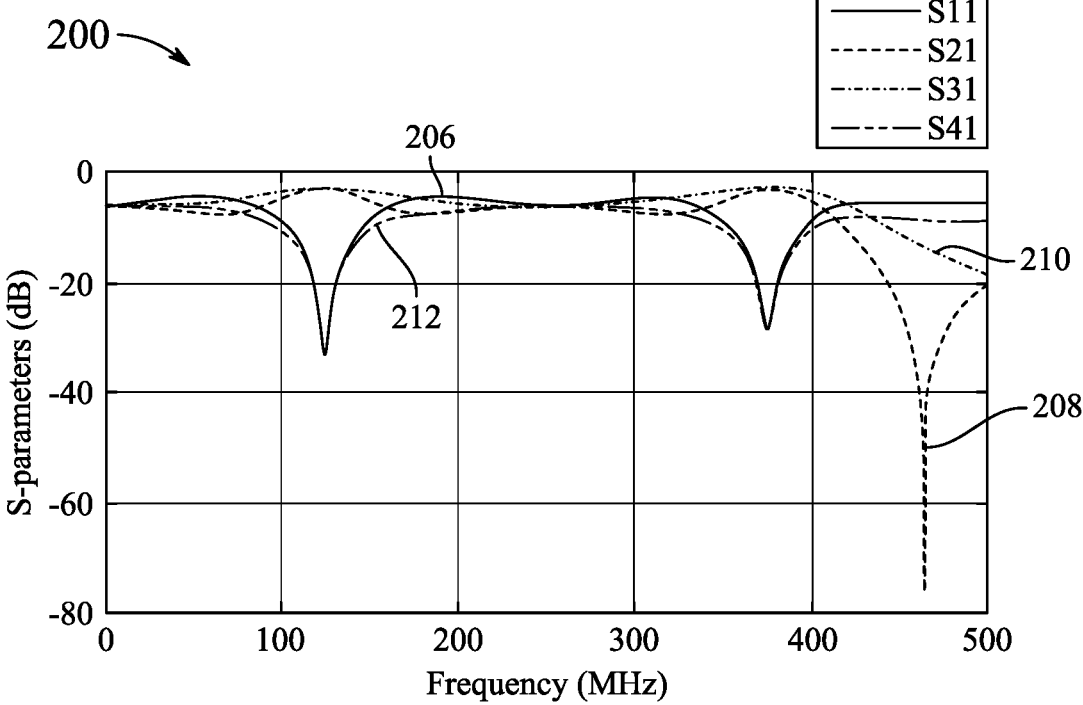
FIG. 2 depicts S-parameters for the hybrid coupler shown in FIG. 1, according to certain embodiments.

FIG. 2 depicts S-parameters 200 for the MSL based hybrid coupler 100 shown in FIG. 1. The S-parameters 200 results have been obtained from the EM-simulation offered by ADS software. FIG. 2 shows the S-parameters 200 for the MSL based hybrid couplers 100 presented in FIG. 1. The S-parameters 200 is a plot of S-parameters in decibels along the y-axis versus frequency in megahertz along the x-axis and includes a curve 206 (for S11), a curve 208 (for S21), a curve 210 (for S31) and a curve 212 (for S41). The fundamental frequency (127.8 MHz) and the third harmonic frequency (383.4 MHZ) appear clearly in the return loss (S11) curve 206. Also, a good matching can be observed at both frequencies S11=−33 dB at 127.8 MHz and S11=−28.5 dB at 383.4 MHz. In addition, the characteristic of the equally split (3±0.2 dB) of the input signal at 127.8 MHz and 383.4 MHz appears in the insertion loss curves between port 1 102 and port 2 104 and port 3 106 (S21 and S31). The isolation characteristic between port 1 102 and port 4 108 (33 dB at 127.8 MHz and 28 dB at 383.4 MHZ) is achieved as shown from the curve of S41 212 in FIG. 2.

Figure 3:
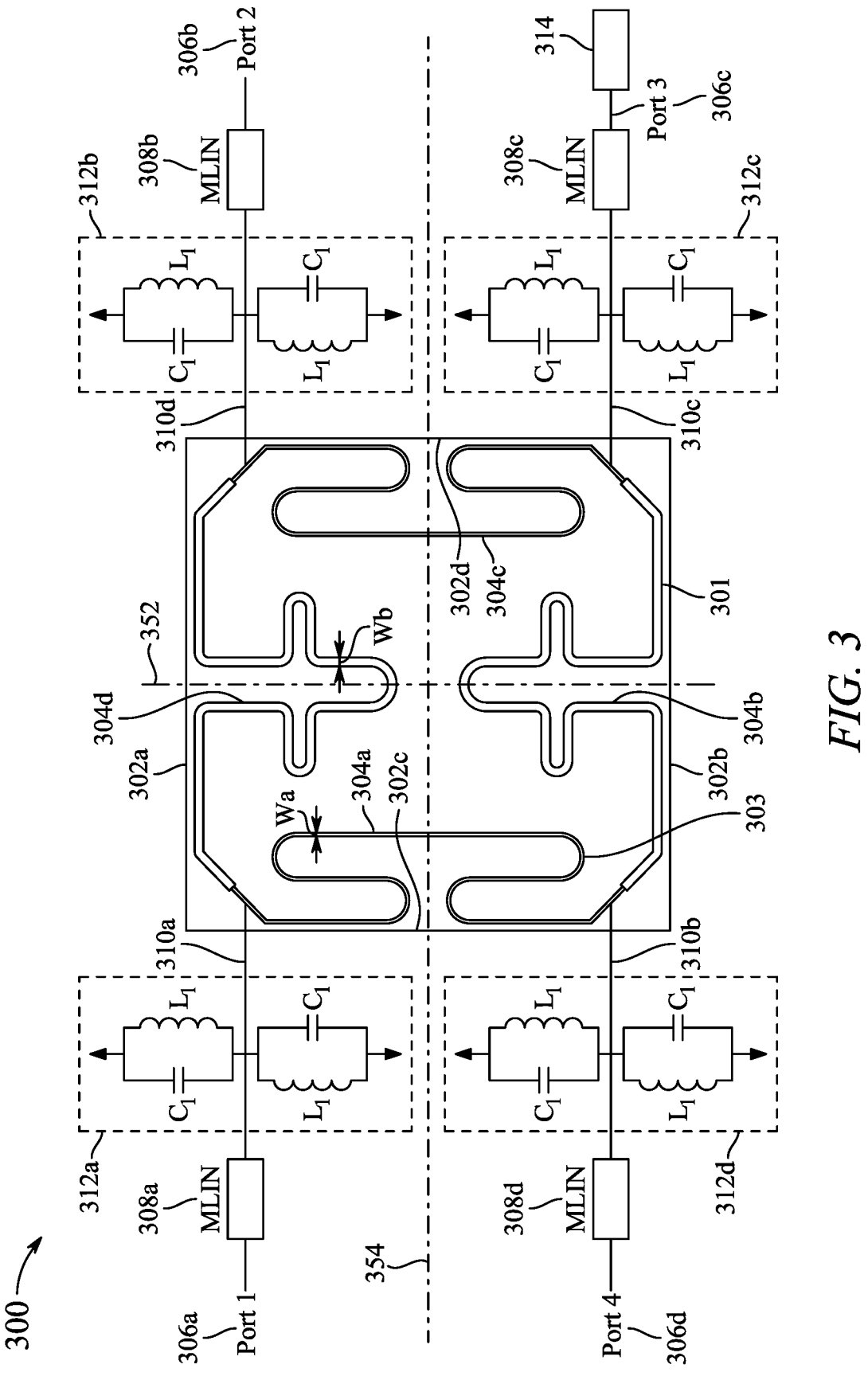
FIG. 3 depicts a circuit of a transmit/receive switch for magnetic resonance imaging (MRI) of a $^1$H atomic nucleus at 3T (tesla) and 7T magnetic field strengths, according to certain embodiments.

FIG. 3 is a circuit of a hybrid coupler for magnetic resonance imaging (MRI) of a $^1$H atomic nucleus at 3T (tesla) and 7T magnetic field strength using the MSL based hybrid coupler 300. The MSL based hybrid coupler 300 includes a dielectric substrate having a first edge 302a opposite a second edge 302b, a third edge 302c opposite a fourth edge 302d, where a first central axis 352 of the dielectric substrate is configured to bisect the first edge 302a and the second edge 302b and to extend from the first edge 302a to the second edge 302b and where a second central axis 354 of the dielectric substrate is configured to bisect the third edge 302c and the fourth edge 302d and to extend from the third edge 302c to the fourth edge 302d. The MSL based hybrid coupler 300 further includes a multi-bended microstripline 303 configured to have a first arm 304a, a second arm 304b, a third arm 304c and a fourth arm 304d. The multi-bended microstripline 303 is connected to a first port 306a which is connected by a microstripline wire 308a to a junction 310a between the first arm 304a and the fourth arm 304d. A first pair of parallel resonant circuits 312a is connected to the junction 310a. A second port 306b is connected by a microstripline wire 308b to a junction 310d between the third arm 304c and the fourth arm 304d and a second pair of parallel resonant circuits 312b is connected to the junction 310d. A third port 306c is connected by a microstripline wire 308c to a junction 310c between the third arm 304c and the second arm 304b and a third pair of parallel resonant circuits 312c is connected to the junction between the third arm 304c and the second arm 304b. A fourth port 306d is connected by a microstripline wire 308d to a junction between the first arm 304a and the second arm 304b and a fourth pair of parallel resonant circuits 312d is connected to the junction 310b. The first arm 304a includes a first angled leg, an S-shaped loop connected to the angled leg, an inverted S-shaped loop connected to the S-shaped loop and a second angled leg, where the S-shaped loop and the inverted S-shaped loop have mirror image symmetry about the second central axis. The second arm 304b includes a first angled leg, a first straight leg parallel to the second edge 302b, a second straight leg perpendicular to the first straight leg, a first loop which extends towards the third edge 302c, a second loop which extends towards the second central axis, a third loop which extends towards the fourth edge 302d, a third straight leg parallel to the second straight leg connected to the third loop, a fourth straight leg parallel to the second edge 302b and extending towards the fourth edge 302d and a second angled leg. The third arm 304c is located opposite the first arm 304a and is a mirror image of the first arm 304a about the first central axis. The fourth arm 304d is located opposite the second arm 304b and is a mirror image of the second arm 304b about the second central axis. The first arm 304a and the third arm 304c each have a microstripline width Wa and the second arm 304b and the fourth arm 304d each have a microstripline width Wb, where the width Wb is about seven times the width Wa. In a non-limiting example, the microstripline width Wa equals about 0.53 mm and the microstripline width Wb equals about 3.51 mm. The multi-bended microstripline coupler 300 is configured to receive radio frequency (RF) electrical signals at the first port 306a and emit secondary electrical signals at a resonance frequency of about 127.8 MHz ($^1$H frequency at 3T) at each of the second port 306b and at the fourth port 306d, where the secondary electrical signals at the fourth port 306d are orthogonal to the secondary electrical signals at the second port 306b. The multi-bended microstripline coupler 300 is configured to receive RF electrical signals at the first port 306a and emit secondary electrical signals at a third harmonic frequency of about 298 MHZ ($^1$H frequency at 7T) at each of the second port 306b and at the fourth port 306d, where the secondary electrical signals at the fourth port 306d are orthogonal to the secondary electrical signals at the second port 306b, where the secondary electrical signals are equally split between the second port 306b and the fourth port 306d, and where the third port 306c is isolated.

In operation, a $3^{rd}$ harmonic frequency (383.4 MHz) appears in addition to the fundamental frequency in the S-parameters of the multi-bended microstripline coupler 300. In order to tune the $3^{rd}$ harmonic frequency of the multi-bended microstripline coupler 300 to 298 MHz ($^1$H frequency at 7T), the parallel resonant circuits ($L_1C_1$) 312a to 312d were added to the four ports 306a to 306d of the MSL based hybrid coupler 300 as shown in FIG. 3. The parallel resonant circuits (L1, C1) 312a to 312d are designed to provide high impedance at the fundamental frequency and to work as tuned circuits at the 3rd harmonic frequency. In a non-limiting example, $L_1$ 304=85.89 nH and $C_1$ 306=18 pF. As a consequence of the above, the operating frequencies of the multi-bended microstripline coupler 300 are tuned to about 127.8 MHz and about 298 MHz, which are the $^1$H frequencies at 3T and 7T magnetic field strength, simultaneously.

In a non-limiting example, the first arm 304a and the third arm 304c are each configured to have a resistance of about 50Ω and a width of about 1.18 mm and the second arm 304b and the fourth arm 304d are each configured to have a resistance of about 35.35Ω and a width of about 2.25 mm.

Each parallel resonant circuit of the first, second, third and fourth pair of parallel resonant circuits 312a to 312d includes a tuning inductor in parallel with a tuning capacitor. In a non-limiting example, the inductance of the tuning inductor is about 85.89 nH and the capacitance of the tuning capacitor is about 18 pF.

The hybrid coupler 300 also includes a 50Ω terminator 314 connected to the third port. The microstripline wires 308a to 308d each have an impedance characteristic of about 40Ω and a 90° electrical length of about 298 MHz.

In electronics, electrical termination is the practice of ending a transmission line with a device that matches the characteristic impedance of the line. Termination prevents signals from reflecting off the end of the transmission line. Reflections at the ends of unterminated transmission lines cause distortion, which can produce ambiguous digital signal levels and poor operation of digital systems. Signal termination often requires the installation of a terminator at the beginning and end of a wire or cable to prevent an RF signal from being reflected back from each end, causing interference, or power loss. The terminator is usually placed at the end of a transmission minimize signal reflections, and power losses.

Radio frequency currents tend to reflect from discontinuities in the cable, such as connectors and joints, and travel back down the cable toward the source, causing interference as primary reflections. Secondary reflections can also occur at the cable starts, allowing interference to persist as repeated echoes of old data. These reflections also act as bottlenecks, preventing the signal power from reaching the destination. The 50Ω terminator is configured to isolate Port 3 306c, thus preventing stray reflections and echoes which could affect the signals at Ports 2 and 4.

Figure 4:
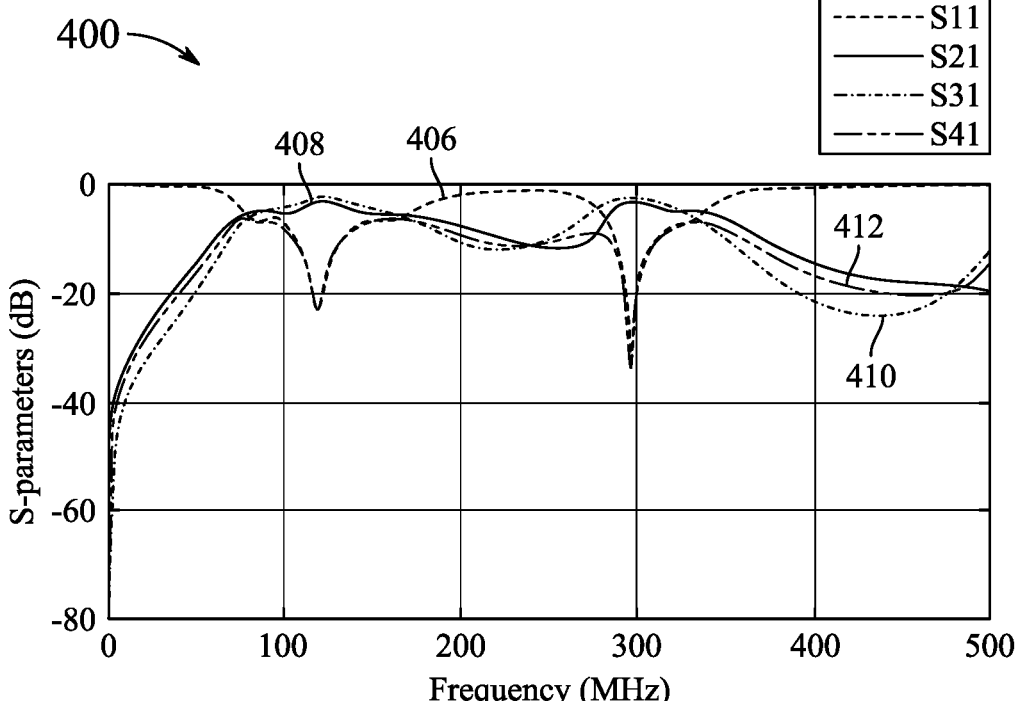
FIG. 4 depicts S-parameters for the hybrid coupler shown in FIG. 3, according to certain embodiments.

FIG. 4 depicts S-parameters 400 for the hybrid coupler shown in FIG. 3, according to certain embodiments. After adding the parallel resonant circuits, the 3rd harmonic frequency of the hybrid coupler 300 is tuned to 298 MHz without affecting the fundamental frequency of the multi-bended microstripline coupler 300 as shown in FIG. 4. The S-parameters 400 of FIG. 4 include a curve 406 (for S11), a curve 408 (for S21), a curve 410 (for S31), a curve 412 (for S41) obtained by plotting S-parameters in decibels along y-axis and frequency along x-axis. However, a degradation in the matching performance appears due to the tuning process. This consequence is solved by inserting the microstripline wires (308a to 308d) in series to each coupler port as shown in FIG. 3 in order to improve the matching performance of the hybrid coupler 300. The microstripline is characterized by an impedance characteristic ($Z_o$) of 40 ohms (Ω) and 90° electrical length at 298 megahertz (MHz). FIG. 4 shows a good match at the fundamental frequency of 127.8 MHz (S11 402=−23.3 dB) and at the third harmonic frequency of 298 MHz (S11 402=−29 dB). In addition, the characteristic of the equally splitting (3±0.2 dB) the input signal at 127.8 MHz and 298 MHz appears in the insertion loss curves between port 1 102 and ports 2 104 and 3 106 (S21 404 and S31 406). The isolation characteristic between port 1 102 and port 4 108 (23.4 dB at 127.8 MHz and 29 dB at 383.4 MHz) is achieved as shown by the curve of S41 408 in FIG. 4.

FIG. 5 depicts the circuit of a transmit/receive switch for magnetic resonance imaging (MRI) of a $^1$H atomic nucleus at 3T (tesla) and 7T magnetic field strength. The transmit/receive switch 500 includes a first dielectric substrate and a second dielectric substrate, where each dielectric substrate includes a top side, a bottom side, a first edge opposite to a second edge, a third edge opposite to a fourth edge, where a first central axis of each dielectric substrate is configured to bisect the first edge and the second edge and to extend from the first edge to the second edge and where a second central axis of each dielectric substrate is configured to bisect the third edge and the fourth edge and to extend from the third edge to the fourth edge. The transmit/receive switch 500 also includes a first microstripline hybrid coupler 300 formed on the first dielectric substrate, where the first microstripline hybrid coupler 300 includes a multi-bended microstripline 303, a second microstripline hybrid coupler 503 formed on the second dielectric substrate, wherein the second microstripline hybrid coupler 503 includes a multi-bended microstripline 505 and wherein the multi-bended microstripline 505 of the second microstripline hybrid coupler 503 is identical in construction to the multi-bended microstripline 303 of the first microstripline hybrid coupler 300. Each of the multi-bended microstriplines (303/505) includes a first arm (304a/504a), a second arm (304b/504b), a third arm (304c/504c) and a fourth arm (304d/504d). A first junction (310a/510a) is located between the first arm (304a/504a) and the fourth arm (304d/504d), a second junction (310b/510b) is located between the first arm (304a/504a) and the second arm (304b/504b), a third junction (310c/510c) is located between the second arm (304b/504b) and the third arm (304c/504c) and a fourth junction (310d/510d) is located between the third arm (304c/504c) and the fourth arm (304d/504d). The circuit includes a plurality of pairs of parallel resonant circuits (312a to 312d, 512a to 512d), wherein a pair of parallel resonant circuits is connected to each of the first junction (310a/510a), the second junction (310b/510b), the third junction (310c/510c) and the fourth junction (310d/510d) of the respective first microstripline hybrid coupler 300 and second microstripline hybrid coupler 503. The multi-bended microstripline coupler (300/503) also includes a first port 306a connected to the first junction 310a of the first microstripline hybrid coupler 300, where the first port 306a is configured to transmit radio frequency (RF) electromagnetic signals into the first junction 310a of the first microstripline hybrid coupler 300 by a signal source which generates the RF electromagnetic signals (shown in FIG. 8 and FIG. 9). A second port 306d is connected to the second junction 310b of the first microstripline hybrid coupler 300, a third port 506a is connected to the third junction 510c of the second microstripline hybrid coupler 503 and a fourth port 506b is connected to the fourth junction 510d of the second microstripline hybrid coupler 503.

A switching circuit is connected between the first microstripline hybrid coupler 300 and the second microstripline hybrid coupler 503. The switching circuit includes a first terminal of a first PIN diode 514a connected to microstripline wires 308b and 508a which connect the fourth junction 310d of the first microstripline hybrid coupler 300 to the first junction 510a of the second microstripline hybrid coupler 503. A first terminal of a second PIN diode 514b is connected to microstripline wires 308c and 508d which connect the third junction 310c of the first microstripline hybrid coupler 300 to the second junction 510b of the second microstripline hybrid coupler 503. A second terminal end of each PIN diode is connected to the ground plane.

In a transmission state, the first PIN diode 514a and the second PIN diode 514b are forward biased and RF signals applied to the first port 306a radiate at a fundamental frequency of about 127.8 MHz at the second port 306b. In a reception state, the first PIN diode 514a and the second PIN diode 514b are reverse biased, and 3T and 7T magnetic field strength electromagnetic signals generated by the MRI imaging of the ¹H atomic nucleus received by the first microstripline hybrid coupler 300 and the second microstripline hybrid coupler 503 are radiated at a first resonant frequency corresponding to the Larmor frequency of the ¹H nucleus at 3T (127.8 MHz) and at a third harmonic frequency corresponding to the Larmor frequency at 7T (298 MHz) magnetic field strengths, simultaneously, from the fourth port 506b.

Between the first microstripline coupler 300 and the second microstripline hybrid coupler 503, the two PIN diodes (514a/514b) are connected to switch between the transmission state and the reception state. During the transmission state, the radio frequency (RF) signal is inserted into the first port 306a, to be delivered to port 2. This requires that the two PIN diodes 514a and 514b are forward-biased. During the reception state, the RF signal detected by the RF coil will be passed through the two couplers 300/503 and delivered to the fourth port 506b (the receiver). This requires the two PIN diodes 514a and 514b to be reverse-biased. The transmit/receive (T/R) switch 500 enables the switching between transmit and receive modes. During a transmit mode, the T/R switch 500 transmits radiofrequency (RF) pulses to the RF coil to be directed from the MRI system to the body being imaged. During a receive mode, the T/R switch 500 detects the resulting MR signals, which are then used to construct the MRI image. The use of T/R switches ensures that the RF energy is delivered during transmit from the RF amplifier to the RF coil and to handle the receive signal from the coil to a receiver pre-amplifier (shown in FIG. 9). Additionally, the T/R switch 500 provides isolation between the transmit and receive paths, which is essential for achieving high-quality images with minimal distortion. The T/R switch 500 prevents interference and noise in the detected signals.

The T/R switch 500 is connected to an RF signal generator (see FIG. 8) which is connected to the first port 306a, where the RF signal generator is configured to transmit the RF electromagnetic signals to the first port 306a. In a non-limiting example, each parallel resonant circuit (312a to 312d/512a to 512d) includes an inductor having a value of about 85.89 nanohenry (nH) and a capacitor having a value of about 18 Picofarad (pF) which resonates with the signal input or output from a respective port.

The first arm (304a/504a), the second arm (304b/504b), the third arm (304c/504c) and the fourth arm (304d/504d) of each multi-bended microstripline coupler (300/503) are configured such that the first arm (304a/504a) includes a first angled leg, an S-shaped loop connected to the straight leg, an inverted S-shaped loop connected to the S-shaped loop, and a second angled leg. The S-shaped loop and the inverted S-shaped loop each have mirror image symmetry about the second central axis. The second arm (304b/504b) includes a first angled leg, a first straight leg parallel to the second edge, a second straight leg perpendicular to the first straight leg, a first loop which extends towards the first edge, a second loop which extends towards the second central axis of the respective multi-bended microstripline, a third loop which extends towards the fourth edge, a third straight leg parallel to the second straight leg, a fourth straight leg parallel to the second edge and extending towards the fourth edge, and a second angled leg. The third arm (304c/504c) is located opposite the first arm (304a/504a) and is a mirror image of the first arm (304a/504a) about the first central axis of the respective multi-bended microstripline and the second arm (304b/504b) is located opposite the fourth arm 304d/504d and is a mirror image of the second arm 304b/504b about the second central axis.

For each multi-bended microstripline coupler (300/503) the first arm (304a/504a) and the third arm (304c/504c) each have mirror image symmetry about the first central axis and the second arm (304b/504b) and the third arm (304c/504c) each have mirror image symmetry about the second central axis. For each multi-bended microstripline coupler (300/503) the first arm (304a/504a) and the third arm (304c/504c) are each configured to have a resistance of about 50Ω and a width of about 1.18 mm and the second arm (304b/504b) and the fourth arm (304d/504d) are each configured to have a resistance of about 35.35Ω and a width of about 2.25 mm.

In an aspect of the present disclosure, for each multi-bended microstripline coupler (300/503), the width Wa of each of the microstriplines 304a, 304c, 504a and 504c equals about 0.53 mm and the width Wb of each of the microstriplines 304b, 304d, 504b and 504d equals about 3.51 mm.

In an aspect of the present disclosure, the transmit/receive switch also includes a 50Ω terminator connected to the third port 506a.

The transmit/receive switch 500 also includes a plurality of microstripline wires (308a to 308d, 508a to 508d), wherein a microstripline wire is connected between each port (306a to 306d and 506a to 506b) and each junction (310a to 310d and 510a to 510d) of each of the first microstripline coupler 300 and the second microstripline hybrid coupler 503. In a non-limiting example, each microstripline wire has an impedance characteristic of 40 ohms (Ω) and a 90° electrical length of about 298 megahertz (MHz).

Figure 6:
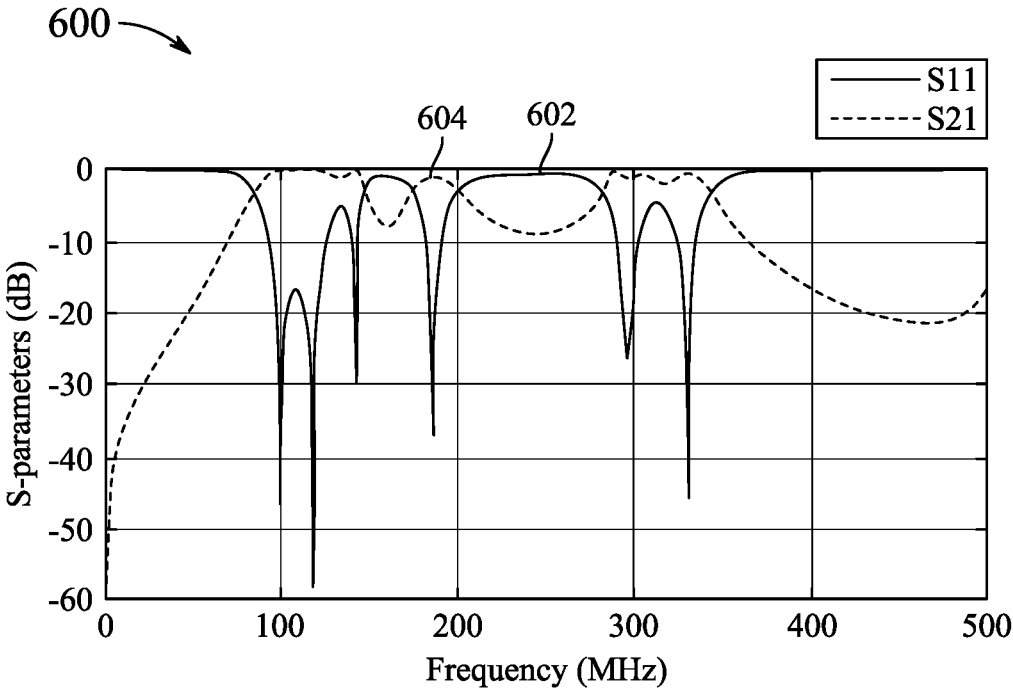
FIG. 6 depicts S-parameters at transmission state for the transmit/receive switch of FIG. 5, according to certain embodiments.

FIG. 6 depicts a plot 600 of the S-parameters at transmission state for the transmit/receive switch 500 of FIG. 5. The S-parameters are indicative of the performance of the transmit/receive switch. FIG. 6 is a plot of the S-parameters versus frequency in megahertz along x-axis. Good impedance matching was demonstrated at the input port (S11 602=−29.5 dB at 127.8 MHz and S11 602=−23.1 dB at 298 MHz) and low insertion loss between ports 1 and 2 (S21 604=−0.1 dB at 127.8 MHz and S21 604=−0.15 dB at 298 MHz). In addition, high isolation between the input port (Port 1) and the receiver port (Port 4) was obtained at −59 dB at 127.8 MHz and −63.5 dB at 298 MHz.

Figure 7:
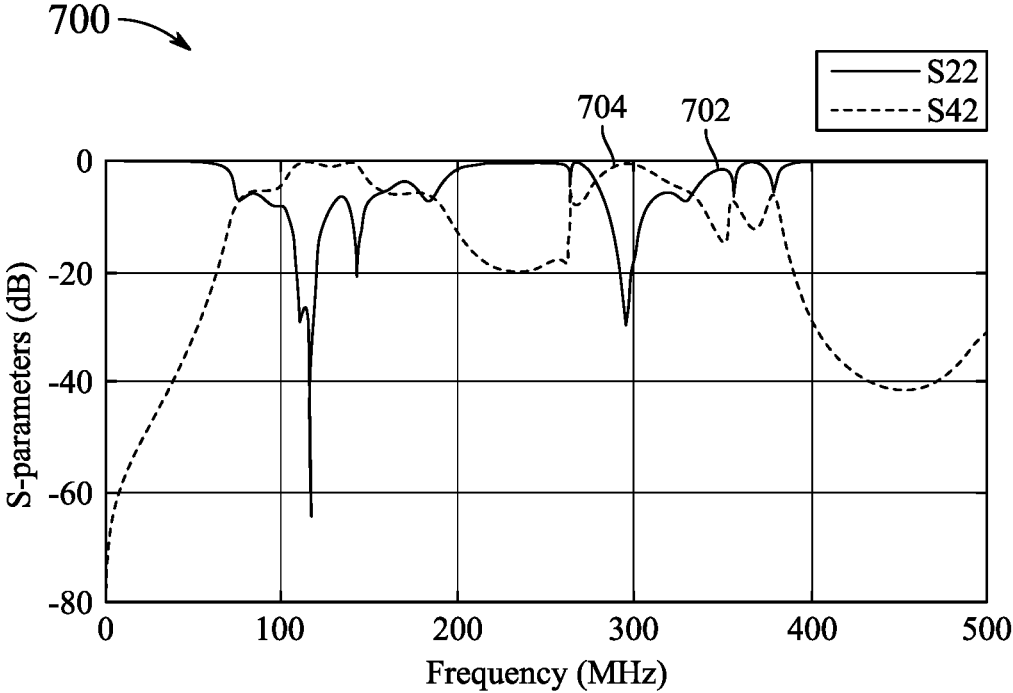
FIG. 7 depicts S-parameters at reception state for T/R switch in FIG. 5, according to certain embodiments.

FIG. 7 depicts a plot 700 of S-parameters during the reception state for the T/R switch of FIG. 5. The plot 700 was obtained by plotting S-parameters versus frequency and includes a curve 702 of the S22 parameters and a curve 704 of the S42 parameters. Good impedance matching was demonstrated at the coil port (Port 2) (S22 702=−18.7 dB at 127.8 MHz and S22 702=−24.8 dB at 298 MHz) and low insertion loss between port 2 and port 4 (S42 704=−0.2 dB at 127.8 MHz and S42 704=−0.1 dB at 298 MHz).

FIG. 8 depicts a transmit mode of the ${}^1$H 3T and 7T MRI T/R switch 800 with the first PIN diode and the second PIN diode forward biased. The RF signal generator is ON at port 1 and the RF coil is connected to port 2 to transmit the signal to the patient. The pin diodes PIN 1 and PIN 2 are forward biased 800, thus there is no transmission to the second coupler (not shown in this view but connected to ports 3 and 4 as shown in FIG. 5). During transmit the T/R switch allows the transmission of radiofrequency (RF) pulses from the MRI system to the body being imaged. In the transmission state, the first PIN diode and the second PIN diode are forward biased, and RF electromagnetic signals received at the first port radiate at a fundamental frequency of 127.8 MHz from the second port.

Figure 9:
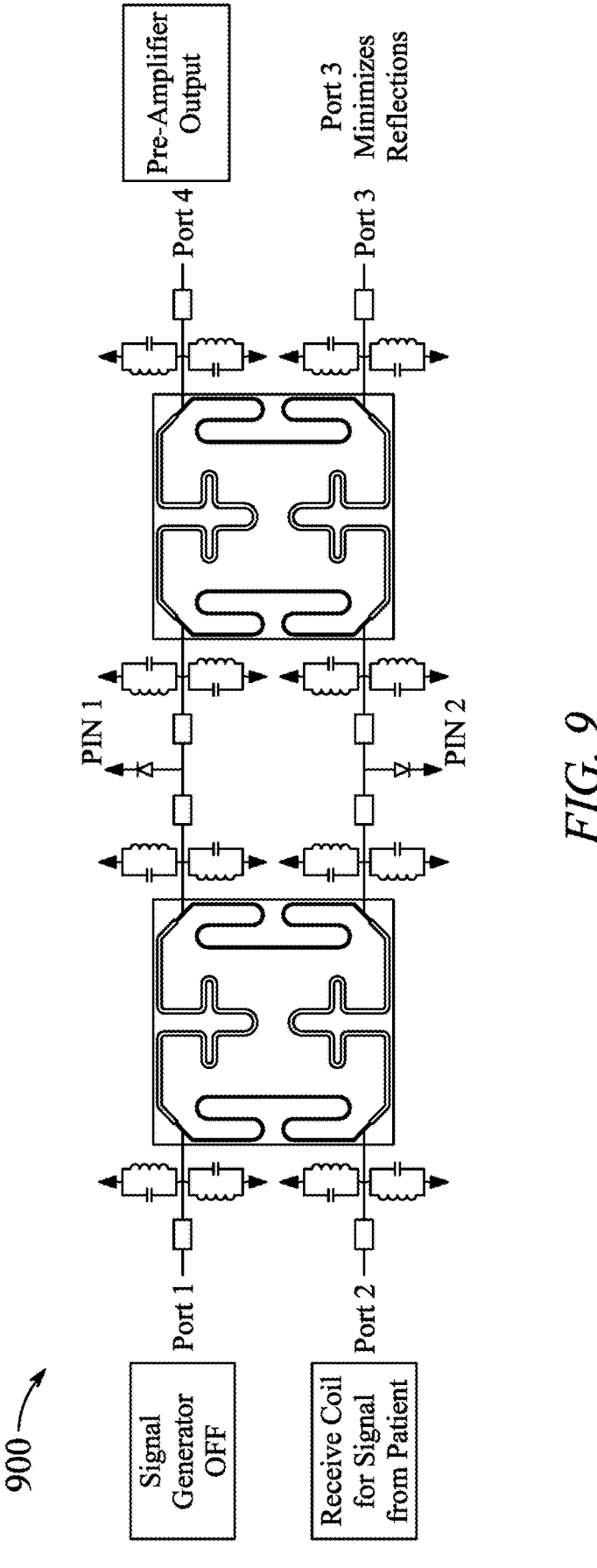
FIG. 9 depicts the $^1$H 3T and 7T MRI T/R switch with first PIN diode and the second PIN diode reverse biased, according to certain embodiments.

FIG. 9 depicts a ${}^1$H 3T and 7T MRI T/R switch 900 with the first PIN diode and the second PIN diode being reverse biased. In FIG. 9, the signal generator is OFF at Port 1. In the reception state, the first PIN diode and the second PIN diode are reverse biased, and 3T and 7T magnetic field strength electromagnetic signals generated by the MRI imaging of the ${}^1$H atomic nucleus are received at Port 2 and delivered to Port 4 to be received by a pre-amplifier. During the reception state, the switch enables the detection of the resulting MR signals, which are then used to construct the MRI image.

FIG. 10 depicts a flowchart of a method of forming and operating a hybrid microstripline transmit/receive switch for magnetic resonance imaging (MRI) of X-atomic nuclei at 3 tesla (T) and 7T magnetic field strengths. The method 1000 includes at step 1002, forming a first multi-bended microstripline coupler 300 on the first dielectric substrate 301. At step 1004, a second multi-bended microstripline coupler 503 on a second dielectric substrate 501 is formed (see also FIG. 5). The first multi-bended microstripline coupler 300 and the second multi-bended microstripline hybrid coupler 503 are identical in construction. Each multi-bended microstripline coupler includes a first arm, a second arm, a third arm and a fourth arm, a first junction located between the first arm and the fourth arm, a second junction located between the first arm and the second arm, a third junction located between the second arm and the third arm, a fourth junction located between the third arm and the fourth arm. At step 1006, a plurality of pairs of parallel resonant circuits are formed. At step 1008, a pair of parallel resonant circuits are connected to each of the first junction, the second junction, the third junction, and the fourth junction of each of the first multi-bended microstripline coupler 300 and the second multi-bended microstripline hybrid coupler 503.

FIG. 11 depicts a flowchart of a method 1000 of operating a hybrid microstripline transmit/receive switch for magnetic resonance imaging (MRI) of X-atomic nuclei at 3 tesla (T) and 7T magnetic field strengths. At step 1102, a first port 306a is connected to the first junction 310a of the first multi-bended microstripline coupler 300 (as shown in FIG. 5). At step 1104, a second port 306d is connected to the second junction 310b of the first multi-bended microstripline coupler 300. At step 1106, a third port 506c is connected to the third junction 510c of the second multi-bended microstripline hybrid coupler 503. At step 1108, a fourth port 506b is connected to the fourth junction 510d of the second multi-bended microstripline hybrid coupler 503. At step 1110, a terminal of a first PIN diode 514a is connected between the fourth junction 310d of the first microstripline hybrid coupler 300 and the first junction 510a of the second microstripline hybrid coupler 503. At step 1112, a terminal of a second PIN diode 514b is connected to the third junction 310c of the first microstripline hybrid coupler 300 and the second junction 510b of the second microstripline hybrid coupler. At step 1114, a 50Ω terminator is connected to the third port. The 50Ω terminator is configured to isolate the third port. At step 1116, the hybrid microstripline transmit/receive switch is configured to be operated in a transmission mode. In step 1118, the hybrid microstripline transmit/receive switch is operated by forward biasing the first pin diode and the second pin diode. At step 1120, RF electrical signals are applied with the power amplifier to the first port of the hybrid microstripline transmit/receive switch. At step 1122, electromagnetic signals are radiated at a fundamental frequency of about 127.8 MHz and at a third harmonic frequency of 298 MHz from the second port. At step 1124, the electromagnetic signals are transmitted to a radio frequency coil of a magnetic resonance imager focused on a $^1$H atomic nucleus. At step 1126, the hybrid microstripline transmit/receive switch is configured to be operated in a reception mode by reverse biasing the first pin diode 514a and the second pin diode 514b. In step 1128, the first pin diode 514a and the second pin diode 514b are reverse biased. In step 1130, 3T and 7T magnetic field strength electromagnetic signals generated by the MRI imaging of the $^1$H atomic nucleus are received by the first microstripline hybrid coupler 300 and the second microstripline hybrid coupler 503 at the fourth port 306d. In step 1132, the received electromagnetic signals are radiated from the fourth port.

In an implementation, the method 1100 also includes configuring the first arm, the second arm, the third arm and the fourth arm of each multi-bended microstripline coupler 300/503. The first arm includes a first angled leg, an S-shaped loop connected to the angled leg, an inverted S-shaped loop connected to the S-shaped loop, and a second angled leg connected to the inverted S-shaped loop, wherein the S-shaped loop and the inverted S-shaped loop have mirror image symmetry about the second central axis. The second arm includes a first angled leg, a first straight leg parallel to the second edge, a second straight leg perpendicular to the first straight leg, a first loop which extends towards the first edge, a second loop which extends towards the second central axis, a third loop which extends towards the fourth edge, a third straight leg parallel to the second straight leg, a fourth straight leg parallel to the second edge and extending towards the fourth edge and a second angled leg connected to the fourth straight leg. The third arm is located opposite the first arm and is a mirror image of the first arm about the first central axis. The second arm is located opposite the fourth arm and is a mirror image of the second arm about the second central axis.

The method 1000 also includes configuring the first arm and the third arm to each have mirror image symmetry about the second central axis and configuring the second arm and the third arm to each have mirror image symmetry about the first central axis.

The present disclosure provides a transmit/receive switch for magnetic resonance imaging MRI) of a $^1$H atomic nucleus at 3T and 7T magnetic field strengths, that can handle the $^1$H magnetic resonance signals to/from the RF coil at 3T and 7T magnetic field strength. The transmit/receive switch employs two hybrid couplers. For the transmission state, one hybrid coupler is used, whereas two hybrid couplers are needed at a reception state. Each coupler has been designed to operate at a fundamental frequency of 127.8 MHz (1H frequency at 3T). The 3rd harmonic frequency has been tuned to 298 MHz (1H frequency at 7T) by using parallel LC networks. At the transmission state, the results showed good matching (return loss<23 dB), low insertion loss (<0.2 dB), and high isolation (>59 dB). At the reception state, the results showed good matching (return loss<18 dB) and low insertion loss (<0.2 dB).

Embodiments of the present disclosure are illustrated with respect to FIG. 1 to FIG. 10.

The first embodiment is illustrated with respect to FIG. 1 to FIG. 3. The first embodiment describes a hybrid coupler 300 for magnetic resonance imaging (MRI) of a $^1$H atomic nucleus at 3T (tesla) and 7T magnetic field strengths. The hybrid coupler 300 includes a dielectric substrate having a first edge 302a opposite a second edge 302b, a third edge 302c opposite a fourth edge 302d, wherein a first central axis 352 of the dielectric substrate is configured to bisect the first edge 302a and the second edge 302b and to extend from the first edge 302a to the second edge 302b and wherein a second central axis 354 of the dielectric substrate is configured to bisect the third edge 302c and the fourth edge 302d and to extend from the third edge 302c to the fourth edge 302d. A multi-bended microstripline of the hybrid coupler 300 is configured to have a first arm 304a, a second arm 304b, a third arm 304c and a fourth arm 304d, a first port 306a connected by a microstripline wire 308a to a first junction 310a between the first arm 304a and the fourth arm 304d, a first pair of parallel resonant circuits 312a connected to the first junction 310a between the first arm 304a and the fourth arm 304d, a second port 306b connected by a microstripline wire 308b to a junction 310d between the third arm 304c and the fourth arm 304d, a second pair of parallel resonant circuits 312b connected to the junction 310a between the third arm 304c and the fourth arm 304d, a third port 306c connected by a microstripline wire 308c to a junction 310c between the third arm 304c and the second arm 304b, a third pair of parallel resonant circuits 312c connected to the first junction 310c, a fourth port 306d connected by a microstripline wire 308d to a junction 310b between the first arm 304a and the second arm 304b, a fourth pair of parallel resonant circuits 312d connected to the junction 310b between the first arm 304a and the second arm 304b. The first arm 304a includes a first angled leg, an S-shaped loop connected to the straight leg, an inverted S-shaped loop connected to the S-shaped loop, and a second angled leg. The S-shaped loop and the inverted S-shaped loop have mirror image symmetry with one another about the second central axis. The second arm 304b includes a first angled leg, a first straight leg parallel to the second edge 302b, a second straight leg perpendicular to the first straight leg, a first loop which extends towards the third edge 302c, a second loop which extends towards the second central axis 354, a third loop which extends towards the fourth edge 302d, a third straight leg parallel to the second straight leg, a fourth straight leg parallel to the second edge 302b and extending towards the fourth edge 302d and a second angled leg. The third arm 304c is located opposite the first arm 304a and is a mirror image of the first arm 304a about the first central axis. The fourth arm 304d is located opposite the second arm 304b and is a mirror image of the second arm 304b about the second central axis. The first arm 304a and the third arm 304c each have a microstripline width Wa, the second arm 304b and the fourth arm 304d each have a microstripline width Wb, wherein the microstripline width Wb is about seven times the microstripline width Wa. The multi-bended microstripline coupler 300 is configured to receive RF electrical signals at the first port 306a and transmit RF electrical signals at a resonance frequency of about 127.8 MHz and at a third harmonic frequency of about 298 MHz at each of the second port 306b and at the fourth port 306d. The secondary electrical signals at the fourth port 306d are orthogonal to the secondary electrical signals at the second port 306b. The third port 306c is isolated.

In an aspect, the first arm 304a and the third arm 304c are each configured to have a resistance of about 50Ω and a width of about 1.18 mm, and the second arm 304b and the fourth arm 304d are each configured to have a resistance of about 35.35Ω and a width of about 2.25 mm.

In an aspect, each parallel resonant circuit of the first, second, third and fourth pair of parallel resonant circuits includes a tuning inductor in parallel with a tuning capacitor.

The inductance of the tuning inductor is about 85.89 nH and the capacitance of the tuning capacitor is about 18 pF.

In an aspect, the width Wa equals about 0.53 mm and the width Wb equals about 3.51 mm.

In an aspect, the hybrid coupler 300 includes a 50Ω terminator connected to the third port 306c.

In an aspect, each microstripline wire has an impedance characteristic of 40Ω and a 90° electrical length at about 298 MHz 1H.

In an aspect, the first arm 304a and the third arm 304c each have mirror image symmetry about the second central axis, and the second arm 304b and the third arm 304c each have mirror image symmetry about the first central axis.

The second embodiment is illustrated with respect to FIG. 3 to FIG. 9. The second embodiment describes a transmit/receive switch 500 for magnetic resonance imaging (MRI) of a ¹H atomic nucleus at 3T (tesla) and 7T magnetic field strengths. The transmit/receive switch 500 includes a first dielectric substrate and a second dielectric substrate, wherein each dielectric substrate (300/503) includes a top side, a bottom side, a first edge (302a/502a) opposite to a second edge (302b/502b), a third edge (302c/502c) opposite to a fourth edge (302d/502d), wherein a first central axis (352/552) of each dielectric substrate (300/503) is configured to bisect the first edge (302a/502a) and the second edge (302b/502b) and to extend from the first edge (302a/502a) to the second edge (302b/502b) and wherein a second central axis 354 is configured to bisect the third edge 302c of the first microstripline coupler 300 and the fourth edge 502d of the second microstripline hybrid coupler 503 and to extend from the third edge 302c of the first microstripline coupler 300 to the fourth edge 502d of the second microstripline hybrid coupler 503. A first microstripline hybrid coupler 300 as described with respect to FIG. 3 is formed on the first dielectric substrate 301, and a second microstripline hybrid coupler 503 identical to the first microstripline hybrid coupler 300 is formed on the second dielectric substrate 501. The first microstripline hybrid coupler 300 includes a multi-bended microstripline 303. The second microstripline hybrid coupler 503 includes a multi-bended microstripline 505. The multi-bended microstripline 505 of the second microstripline hybrid coupler 503 is identical in construction to the multi-bended microstripline 303 of the first microstripline hybrid coupler 300. Each multi-bended microstripline (303, 505) includes: a first arm, a second arm, a third arm and a fourth arm, a first junction located between the first arm and the fourth arm, a second junction located between the first arm and the second arm, a third junction located between the second arm and the third arm, a fourth junction located between the third arm and the fourth arm. The transmit/receive switch 500 includes a plurality of pairs of parallel resonant circuits 312a to 312d and 512a to 512d. A pair of parallel resonant circuits is connected to each of the first junction, the second junction, the third junction and the fourth junction of the first microstripline hybrid coupler 300 and the second microstripline hybrid coupler 503. A first port 306a is connected to the first junction 310a of the first microstripline hybrid coupler 300. The first port 306a is configured to transmit radio frequency electromagnetic signals into the first junction 310a of the first microstripline hybrid coupler 300. The transmit/receive switch 500 includes a second port 306d connected to the second junction 310b of the first microstripline hybrid coupler 300, a third port 506a connected to the third junction 510c of the second microstripline hybrid coupler 503, a fourth port 506b connected to the fourth junction 510d of the second microstripline hybrid coupler 503, and a switching circuit connected between the first microstripline hybrid coupler 300 and the second microstripline hybrid coupler 503. The switching circuit includes a first PIN diode 514a having a first terminal connected to the fourth junction 310d of the first microstripline hybrid coupler 300 and to the first junction 510a of the second microstripline hybrid coupler 503 and a second terminal connected to a ground plane of the first dielectric substrate, and a second PIN diode 514b having a first terminal connected to the third junction 310c of the first microstripline hybrid coupler 300 and to the second junction 510b of the second microstripline hybrid coupler 503 and second terminal connected to the ground plane. In a transmission state, the first PIN diode 514a and the second PIN diode 514b are forward biased 800 and RF electromagnetic signals are applied to the first port 306a and emitted from the second port 306d. In a reception state, the first PIN diode 514a and the second PIN diode 514b are reverse biased, and 3T and 7T magnetic field strength electromagnetic signals generated by the MRI imaging of the ¹H atomic nucleus are received by the first microstripline hybrid coupler 300 and the second microstripline hybrid coupler 503 and are radiated from the fourth port 506b.

In an aspect, the transmit/receive switch includes a power amplifier connected to the first port. The power amplifier is configured to transmit the RF electromagnetic signals to the first port 306a. Each parallel resonant circuit includes an inductor having a value of about 85.89 nH and a capacitor having a value of about 18 pF.

The first arm, the second arm, the third arm and the fourth arm of each multi-bended microstripline coupler (300/503) is configured wherein the first arm includes a first angled leg, an S-shaped loop connected to the straight leg, an inverted S-shaped loop connected to the S-shaped loop, and a second angled leg. The S-shaped loop and the inverted S-shaped loop have mirror image symmetry about the second central axis. The second arm includes a first angled leg, a first straight leg parallel to the second edge, a second straight leg perpendicular to the first straight leg, a first loop which extends towards the third edge, a second loop which extends towards the second central axis, a third loop which extends towards the fourth edge, a third straight leg parallel to the second straight leg, a fourth straight leg parallel to the second edge and extending towards the fourth edge and a second angled leg. The third arm is located opposite the first arm and is a mirror image of the first arm about the first central axis, and the second arm is located opposite the fourth arm and is a mirror image of the second arm about the second central axis.

In an aspect, for each multi-bended microstripline coupler, the first arm and the third arm each have mirror image symmetry about the second central axis, and the second arm and the third arm each have mirror image symmetry about the first central axis.

In an aspect, for each multi-bended microstripline coupler: the first arm and the third arm are each configured to have a resistance of about 50Ω and a width of about 1.18 mm, and the second arm and the fourth arm are each configured to have a resistance of about 35.35Ω and a width of about 2.25 mm.

In an aspect, for each multi-bended microstripline coupler 300 coupler, the width Wa equals about 0.53 mm and the width Wb equals about 3.51 mm.

In an aspect, the transmit/receive switch 500 further includes a 50Ω terminator connected to the third port 306c.

In an aspect, the transmit/receive switch 500 further includes a plurality of microstripline wires, wherein a microstripline wire is connected between each port and each junction of each of the first microstripline coupler and the second microstripline coupler.

In an aspect, the each microstripline wire has an impedance characteristic of 40Ω and a 90° electrical length at about 298 MHz.

The third embodiment is illustrated with respect to FIG. 3, FIG. 5 to FIG. 11. The third embodiment describes a method of using a hybrid microstripline transmit/receive switch for magnetic resonance imaging (MRI) of X-atomic nuclei at 3 tesla (T) and 7T magnetic field strengths. The method includes forming a first multi-bended microstripline coupler 300 on a first dielectric substrate, forming a second multi-bended microstripline coupler 503 on a second dielectric substrate. The first multi-bended microstripline coupler 300 and the second multi-bended microstripline hybrid coupler 503 are identical in construction. Each multi-bended microstripline coupler (300, 503) includes a first arm, a second arm, a third arm and a fourth arm, a first junction located between the first arm and the fourth arm, a second junction located between the first arm and the second arm, a third junction located between the second arm and the third arm, a fourth junction located between the third arm and the fourth arm. The method includes forming a plurality of pairs of parallel resonant circuits, connecting a pair of parallel resonant circuits to each of the first junction, the second junction, the third junction and the fourth junction of each of the first multi-bended microstripline and the second multi-bended microstripline; connecting a first port to the first junction of the first multi-bended microstripline; connecting a second port to the second junction of the first multi-bended microstripline; connecting a third port to the third junction of the second multi-bended microstripline; connecting a fourth port to the fourth junction of the second multi-bended microstripline; connecting a first PIN diode to the fourth junction of the first microstripline hybrid coupler and to the first junction of the second microstripline hybrid coupler; connecting a second PIN diode to the third junction of the first microstripline hybrid coupler and to the second junction of the second microstripline hybrid coupler; connecting a 50Ω terminator to the third port, wherein the 50Ω terminator is configured to isolate the third port. The method includes operating the hybrid microstripline transmit/receive switch 500 in a transmission mode by: forward biasing the first pin diode and the second pin diode, applying, with a power amplifier, RF electrical signals to the first port of the hybrid microstripline transmit/receive switch, radiating electromagnetic signals from the second port, transmitting the electromagnetic signals to a radio frequency coil of a magnetic resonance imager focused on a $^1$H atomic nucleus. The method includes operating the hybrid microstripline transmit/receive switch in a reception mode by: reverse biasing the first pin diode and the second pin diode, receiving, by the first microstripline hybrid coupler and the second microstripline magnetic coupler, 3T and 7T magnetic field strength electromagnetic signals generated by the MRI imaging of the $^1$H atomic nucleus, and radiating the received electromagnetic signals from the fourth port.

In an aspect, the method further includes configuring the first arm, the second arm, the third arm and the fourth arm of each multi-bended microstripline coupler. The first arm includes a first angled leg, an S-shaped loop connected to the straight leg, an inverted S-shaped loop connected to the S-shaped loop, and a second angled leg. The S-shaped loop and the inverted S-shaped loop have mirror image symmetry about the second central axis, the second arm includes a first angled leg, a first straight leg parallel to the second edge, a second straight leg perpendicular to the first straight leg, a first loop which extends towards the first edge, a second loop which extends towards the second central axis, a third loop which extends towards the fourth edge, a third straight leg parallel to the second straight leg, a fourth straight leg parallel to the second edge and extending towards the fourth edge and a second angled leg.

In an aspect, the third arm is located opposite the first arm and is a mirror image of the first arm about the first central axis, and the second arm is located opposite the fourth arm and is a mirror image of the second arm about the second central axis.

In an aspect, the method further includes configuring the first arm and the third arm of each multi-bended microstripline to each have mirror image symmetry about the second central axis and configuring the second arm and the third arm to each have mirror image symmetry about the first central axis.

Numerous modifications and variations of the present disclosure are possible in light of the above teachings. It is therefore to be understood that within the scope of the appended claims, the invention may be practiced otherwise than as specifically described herein.

The invention claimed is:

1. A hybrid coupler for magnetic resonance imaging (MRI) of a $^1$H atomic nucleus at 3T (tesla) and 7T magnetic field strengths, comprising:

a dielectric substrate having a first edge opposite a second edge and a third edge opposite a fourth edge, wherein a first central axis of the dielectric substrate is configured to bisect the first edge and the second edge and to extend from the first edge to the second edge and wherein a second central axis of the dielectric substrate is configured to bisect the third edge and the fourth edge and to extend from the third edge to the fourth edge;

a multi-bended microstripline configured to have a first arm, a second arm, a third arm and a fourth arm;

a first port connected by a microstripline wire to a junction between the first arm and the fourth arm;

a first pair of parallel resonant circuits connected to the junction between the first arm and the fourth arm;

a second port connected by a microstripline wire to a junction between the third arm and the fourth arm;

a second pair of parallel resonant circuits connected to the junction between the third arm and the fourth arm;

a third port connected by a microstripline wire to a junction between the third arm and the second arm, wherein a 50Ω terminator is connected to the third port;

a third pair of parallel resonant circuits connected to the junction between the third arm and the second arm;

a fourth port connected by a microstripline wire to a junction between the first arm and the second arm;

a fourth pair of parallel resonant circuits connected to the junction between the first arm and the second arm, wherein the first arm includes a first angled leg, an S-shaped loop connected to the straight leg, an inverted S-shaped loop connected to the S-shaped loop, and a second angled leg, wherein the S-shaped loop and the inverted S-shaped loop have mirror image symmetry about the second central axis, wherein the second arm includes a first angled leg, a first straight leg parallel to the second edge, a second straight leg perpendicular to the first straight leg, a first loop which extends towards the third edge, a second loop which extends towards the second central axis, a third loop which extends towards the fourth edge, a third straight leg parallel to the second straight leg, a fourth straight leg parallel to the second edge and which extends towards the fourth edge, and a second angled leg, wherein the third arm is located opposite the first arm and is a mirror image of the first arm about the first central axis, wherein the fourth arm is located opposite the second arm and is a mirror image of the second arm about the second central axis, and wherein the first arm and the third arm each have a microstripline width Wa, the second arm and the fourth arm each have a microstripline width Wb, wherein Wb is about seven times Wa;

wherein the multi-bended microstripline is configured to receive RF electrical signals at the first port and transmit RF electrical signals at a resonance frequency of about 127.8 MHz and at a third harmonic frequency of about 298 MHz from each of the second port and at the fourth port, wherein the RF electrical signals transmitted from the fourth port are orthogonal to the RF electrical signals transmitted from the second port, wherein the third port is isolated, wherein the first arm and the third arm have a same width, the first arm and the third arm each have mirror image symmetry about the second central axis; and the first arm and the third arm each have mirror image symmetry about the first central axis.

2. The hybrid coupler of claim 1, wherein:

the first arm and the third arm are each configured to have a resistance of about 50Ω and a width of about 1.18 mm; and the second arm and the fourth arm are each configured to have a resistance of about 35.35Ω and a width of about 2.25 mm.

3. The hybrid coupler of claim 1, wherein each parallel resonant circuit of the first, second, third and fourth pair of parallel resonant circuits includes a tuning inductor in parallel with a tuning capacitor, wherein the inductance of the tuning inductor is about 85.89 nH and the capacitance of the tuning capacitor is about 18 pF.

4. The hybrid coupler of claim 1, wherein the width Wa equals about 0.53 mm and the width Wb equals about 3.51 mm.

5. The hybrid coupler of claim 1, wherein each microstripline wire has an impedance characteristic of 40Ω and a 90° electrical length at about 298 MHz.

6. A transmit/receive switch for magnetic resonance imaging (MRI) of a $^1$H atomic nucleus at 3T (tesla) and 7T magnetic field strengths, comprising:

a first dielectric substrate and a second dielectric substrate, wherein each dielectric substrate includes a top side, a bottom side, a first edge opposite to a second edge, a third edge opposite to a fourth edge, wherein a first central axis of each dielectric substrate is configured to bisect the first edge and the second edge and to extend from the first edge to the second edge and wherein a second central axis of the dielectric substrate is configured to bisect the third edge and the fourth edge and to extend from the third edge to the fourth edge;

a first microstripline hybrid coupler formed on the first dielectric substrate, wherein the first microstripline hybrid coupler includes a multi-bended microstripline;

a second microstripline hybrid coupler formed on the second dielectric substrate, wherein the second microstripline hybrid coupler includes a multi-bended microstripline, wherein the multi-bended microstripline of the second microstripline hybrid coupler is identical in construction to the multi-bended microstripline of the first microstripline hybrid coupler;

wherein each multi-bended microstripline includes:

a first arm, a second arm, a third arm and a fourth arm;

a first junction located between the first arm and the fourth arm;

a second junction located between the first arm and the second arm;

a third junction located between the second arm and the third arm;

a fourth junction located between the third arm and the fourth arm;

a plurality of pairs of parallel resonant circuits, wherein a pair of parallel resonant circuits is connected to each of the first junction, the second junction, the third junction and the fourth junction of the first microstripline hybrid coupler and the second microstripline hybrid coupler;

a first port connected to the first junction of the first microstripline hybrid coupler, wherein the first port is configured to transmit radio frequency electromagnetic signals into the first junction of the first microstripline hybrid coupler;

a second port connected to the second junction of the first microstripline hybrid coupler;

a third port connected to the third junction of the second microstripline hybrid coupler;

a fourth port connected to the fourth junction of the second microstripline hybrid coupler; and a switching circuit connected between the first microstripline hybrid coupler and the second microstripline hybrid coupler, wherein the switching circuit includes:

a first PIN diode having a first terminal connected to the fourth junction of the first microstripline hybrid coupler and to the first junction of the second microstripline hybrid coupler and a second terminal connected to a ground plane located on the bottom side of the first dielectric substrate, a second PIN diode having a first terminal connected to the third junction of the first microstripline hybrid coupler and to the second junction of the second microstripline hybrid coupler and a second terminal connected to a ground plane located on the bottom side of the first dielectric substrate, and a power amplifier connected to the first port, wherein the power amplifier is configured to transmit the RF electromagnetic signals to the first port, wherein, in a transmission state, the first PIN diode and the second PIN diode are configured to be forward biased and RF electromagnetic signals applied to the first port radiate from the second port, and wherein, in a reception state, the first PIN diode and the second PIN diode are configured to be reverse biased, and 3T and 7T magnetic field strength electromagnetic signals generated by the MRI imaging of the $^1$H atomic nucleus are received by the first microstripline hybrid coupler and the second microstripline magnetic coupler and are radiated from the fourth port, wherein the first arm and the third arm have a same width, the first arm and the third arm each have mirror image symmetry about the second central axis; and the first arm and the third arm each have mirror image symmetry about the first central axis.

7. The transmit/receive switch of claim 6, wherein each parallel resonant circuit includes an inductor having a value of about 85.89 nH and a capacitor having a value of about 18 pF.

8. The transmit/receive switch of claim 6, wherein, for each multi-bended microstripline coupler, the width Wa equals about 0.53 mm and the width Wb equals about 3.51 mm.

9. The transmit/receive switch of claim 6, further comprising a 50Ω terminator connected to the third port.

10. The transmit/receive switch of claim 6, further comprising:

a plurality of microstripline wires, wherein a microstripline wire is connected between each port and each junction of each of the first microstripline coupler and the second microstripline coupler.

11. The transmit/receive switch of claim 10, wherein each microstripline wire has an impedance characteristic of 40Ω and a 90° electrical length at about 298 MHz.

* * * * *